(12) United States Patent
Kato et al.

(10) Patent No.: US 11,107,741 B2
(45) Date of Patent: *Aug. 31, 2021

(54) COMPOSITE CERAMIC MULTILAYER SUBSTRATE, HEAT GENERATING ELEMENT-MOUNTING MODULE, AND METHOD OF PRODUCING COMPOSITE CERAMIC MULTILAYER SUBSTRATE

(71) Applicant: Murata Manufacturing Co., Ltd., Nagaokakyo (JP)

(72) Inventors: Tomoki Kato, Nagaokakyo (JP); Yasutaka Sugimoto, Nagaokakyo (JP); Yoichi Moriya, Nagaokakyo (JP); Takahiro Hayakawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 50 days.

This patent is subject to a terminal disclaimer.

(21) Appl. No.: 16/541,208

(22) Filed: Aug. 15, 2019

(65) Prior Publication Data

US 2019/0371689 A1 Dec. 5, 2019

Related U.S. Application Data

(63) Continuation of application No. PCT/JP2018/012855, filed on Mar. 28, 2018.

(30) Foreign Application Priority Data

Mar. 29, 2017 (JP) .............................. JP2017-064522

(51) Int. Cl.
*B32B 3/00* (2006.01)
*H01L 23/15* (2006.01)
(Continued)

(52) U.S. Cl.
CPC .......... *H01L 23/15* (2013.01); *C04B 41/5059* (2013.01); *C04B 41/5066* (2013.01);
(Continued)

(58) Field of Classification Search
None
See application file for complete search history.

(56) References Cited

U.S. PATENT DOCUMENTS

2006/0043583 A1 3/2006 Tamagawa et al.
2009/0200567 A1* 8/2009 Yoon ....................... H01L 33/56
257/98
2019/0047915 A1 2/2019 Itoh et al.

FOREIGN PATENT DOCUMENTS

JP 02-238642 A 9/1990
JP 02-131393 U 10/1990
(Continued)

OTHER PUBLICATIONS

Official Communication issued in International Patent Application No. PCT/JP2018/012855, dated Jun. 26, 2018.

*Primary Examiner* — Seth Dumbris
(74) *Attorney, Agent, or Firm* — Keating & Bennett, LLP

(57) ABSTRACT

A composite ceramic multilayer substrate includes a glass ceramic insulating layer including a wiring layer and a highly thermally conductive ceramic insulating layer made of a ceramic material having a higher thermal conductivity than the glass ceramic insulating layer. The glass ceramic insulating layer is provided on at least one main surface of the highly thermally conductive ceramic insulating layer directly and/or with a wiring layer interposed therebetween. When viewed in a direction perpendicular or substantially perpendicular to a main surface of the composite ceramic multilayer substrate, the composite ceramic multilayer substrate includes at least one heat generating element-mounting portion surrounded by the glass ceramic insulating layer (Continued)

and at which a heat generating element-mounting wiring line provide on the main surface of the highly thermally conductive ceramic insulating layer is exposed.

32 Claims, 17 Drawing Sheets

(51) Int. Cl.
    *C04B 41/50*     (2006.01)
    *C04B 41/87*     (2006.01)
    *H01L 23/13*     (2006.01)
    *H01L 25/07*     (2006.01)
    *H01L 25/18*     (2006.01)
    *H05K 1/02*     (2006.01)
    *H05K 1/03*     (2006.01)
    *H05K 3/46*     (2006.01)
    *F28F 21/04*     (2006.01)
    *H01L 21/48*     (2006.01)
    *H01L 23/31*     (2006.01)
    *H01L 23/373*     (2006.01)
    *H01L 23/00*     (2006.01)

(52) U.S. Cl.
    CPC .............. *C04B 41/87* (2013.01); *F28F 21/04* (2013.01); *H01L 21/4882* (2013.01); *H01L 23/13* (2013.01); *H01L 23/3121* (2013.01); *H01L 23/3735* (2013.01); *H01L 24/32* (2013.01); *H01L 25/07* (2013.01); *H01L 25/18* (2013.01); *H05K 1/0201* (2013.01); *H05K 1/0306* (2013.01); *H05K 3/4629* (2013.01); H01L 2224/32237 (2013.01); H01L 2924/1033 (2013.01); H01L 2924/10272 (2013.01); H01L 2924/1205 (2013.01); H01L 2924/1206 (2013.01); H01L 2924/1207 (2013.01); H01L 2924/13091 (2013.01); H01L 2924/1426 (2013.01)

(56) References Cited

FOREIGN PATENT DOCUMENTS

| | | | |
|---|---|---|---|
| JP | 04-130757 A | | 5/1992 |
| JP | 2000-183260 A | | 6/2000 |
| JP | 2000183260 A | * | 6/2000 |
| JP | 2005-203810 A | | 7/2005 |
| JP | 2006-073651 A | | 3/2006 |
| JP | 2008270741 A | * | 11/2008 |
| JP | 2012-090412 A | | 5/2012 |
| JP | 2016-103518 A | | 6/2016 |
| JP | 2017-183540 A | | 10/2017 |

* cited by examiner

FIG. 1
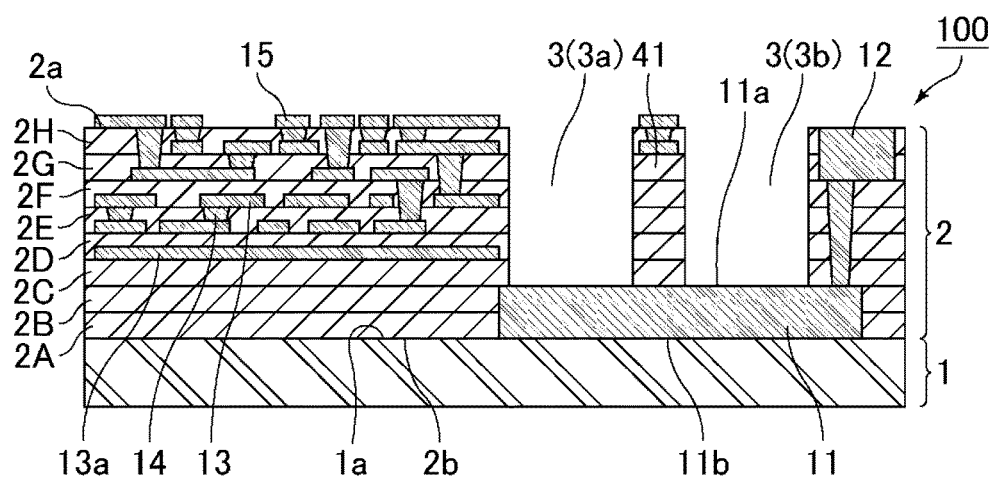
FIG. 2A
FIG. 2B
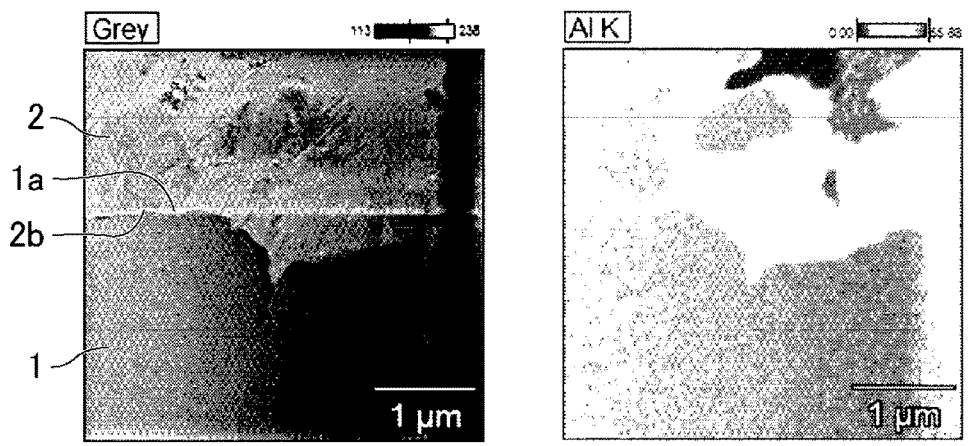
FIG. 2C
FIG. 2D
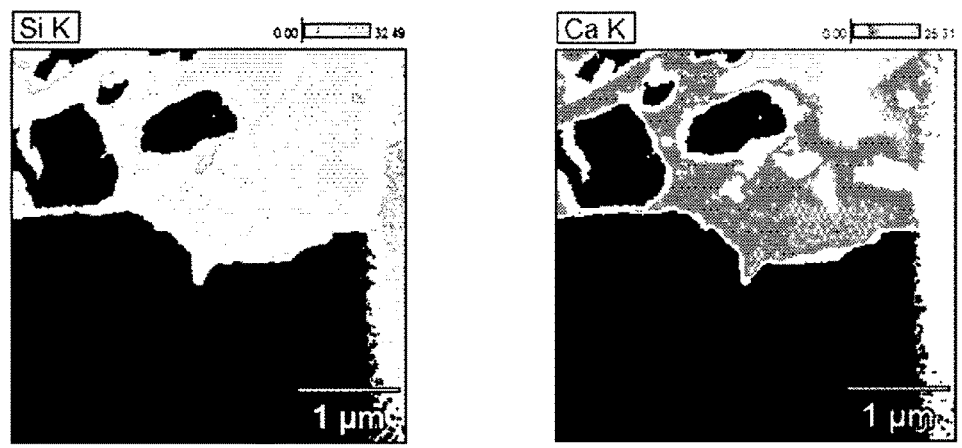

COMPOSITE CERAMIC MULTILAYER SUBSTRATE, HEAT GENERATING ELEMENT-MOUNTING MODULE, AND METHOD OF PRODUCING COMPOSITE CERAMIC MULTILAYER SUBSTRATE

CROSS REFERENCE TO RELATED APPLICATIONS

This application claims the benefit of priority to Japanese Patent Application No. 2017-064522 filed on Mar. 29, 2017 and is a Continuation Application of PCT Application No. PCT/JP2018/012855 filed on Mar. 28, 2018. The entire contents of each application are hereby incorporated herein by reference.

BACKGROUND OF THE INVENTION

1. Field of the Invention

The present invention relates to a composite ceramic multilayer substrate, a heat generating element-mounting module, and a method of producing the composite ceramic multilayer substrate.

2. Description of the Related Art

There are known circuit boards including both power supply components, such as power semiconductors, and control components, such as ICs, chip capacitors, chip inductors, and chip resistors.

Japanese Unexamined Patent Application Publication No. 2012-090412 discloses an arrangement of a power conversion section in a motor-driven electrical apparatus (electric compressor). A power converter is defined by an inverter serving as a power supply circuit and a circuit board serving as a control circuit. The inverter is defined by discrete power elements.

Control elements for controlling switching of the power elements, such as ICs, chip capacitors, and chip resistors, are mounted on the circuit board. The ends of long lead terminals of the power elements are joined to the circuit board. Thus, the power supply circuit and the control circuit are electrically connected to each other.

The power elements are directly attached to a thermally conductive member, and heat generated in the power elements is dissipated through the wall surface.

Although not described in Japanese Unexamined Patent Application Publication No. 2012-090412, a resin substrate or a glass ceramic substrate is generally used for circuit boards defining and functioning as control circuits.

The glass ceramic substrate is preferred because the glass ceramic substrate has a low firing temperature and the inner layer wiring lines and the surface-layer wiring lines can be formed of a low-resistance conductor such as Ag or Cu, which results in a small signal transmission loss.

For the circuit board used for the power supply circuit, a DCB (direct copper bonding) substrate or an AMC (active metal brazed copper) substrate (hereafter only referred to as a "DCB substrate") is employed.

This substrate is obtained by forming thick copper wiring on the front surface of a highly thermally conductive ceramic substrate formed of alumina or the like and forming a thick copper heat dissipation plate on the back surface.

If a DCB substrate is used for the power supply circuit in Japanese Unexamined Patent Application Publication No. 2012-090412, bare power elements are mounted on the thick copper wiring on the front surface of the DCB substrate and the thick copper heat dissipation plate on the back surface is joined to a thermally conductive member.

The power conversion section in the related art is of a "power supply/control separation type" in which a power supply circuit and a control circuit are separated from each other. However, this configuration increases the size of the power conversion section, which inhibits downsizing of electrical apparatuses. Therefore, circuit boards that support a "power supply/control integrated" power conversion section in which a power supply circuit and a control circuit are integrated have been required from the electric/electronic device market.

When a power supply circuit and a control circuit are integrated, the circuit board is selected from a resin substrate or a glass ceramic substrate used for control circuits and a DCB substrate used in power supply circuits.

However, the inventors of preferred embodiments of the present invention have discovered that a resin substrate cannot support a high-temperature operative power element formed of a wide band gap semiconductor (SiC or GaN) because of its low thermal resistance. Furthermore, the resin substrate has a low thermal conductivity and thus heat generated from the power element cannot be efficiently dissipated.

For the glass ceramic substrate, the inventors of preferred embodiments of the present invention have discovered that a thick copper wiring for a large current required by the power supply circuit cannot be formed. The glass ceramic substrate also has a low thermal conductivity and thus heat generated from the power element cannot be efficiently dissipated. Furthermore, the glass ceramic substrate has a low fracture toughness. If power elements are mounted on the glass ceramic substrate, the difference in thermal expansion coefficient between the power elements or mounting members and the glass ceramic substrate and the repeated stress generated by local thermal shock due to the on/off state of the power elements cause microcracking around the power elements. Consequently, the mounting strength cannot be maintained.

For the DCB substrate, the inventors of preferred embodiments of the present invention have discovered that a thick copper plate on the front surface is etched to form wiring, which makes it difficult to form micro-wiring, and inner-layer wiring cannot be formed. Therefore, the DCB substrate is unsuitable for control circuits having a complicated wiring network. That is, the circuit board in the related art cannot meet the market requirement for circuit boards that can be used for a "power supply/control integrated" power conversion section.

Even if circuit boards that can be used for a "power supply/control integrated" power conversion section could have been produced by addressing the above problem, the inventors of preferred embodiments of the present invention have discovered that the power supply circuit and the control circuit come close to each other and thus heat generated during the operation of power elements of the power supply circuit is conducted to control elements of the control circuit through the circuit board. Consequently, the temperature of the control elements exceeds the guaranteed temperature range, which poses an additional problem in that the power supply circuit malfunctions.

In particular, this problem needs to be addressed if power elements that are formed of a wide band gap semiconductor (SiC or GaN), can be operated at a high temperature of about 200° C. or higher, and have received attention recently are used as power elements constituting the power supply circuit.

Substrates on which elements having a large amount of heat generated, such as power elements for circuit boards that can be used for a "power supply/control integrated" power conversion section, are mounted have the above problem. This problem also arises when other heat generating elements such as light-emitting elements are used instead of the power elements.

SUMMARY OF THE INVENTION

Preferred embodiments of the present invention provide composite ceramic multilayer substrates that are each a circuit board including, in an integrated manner, a heat generating element-mounting wiring line on which heat generating elements are to be mounted and a wiring layer that is able to be used as a control circuit, methods for producing the composite ceramic multilayer substrates, and heat generating element-mounting modules on which heat generating elements have been mounted.

A composite ceramic multilayer substrate according to a preferred embodiment of the present invention includes a glass ceramic insulating layer including a wiring layer and a highly thermally conductive ceramic insulating layer made of a ceramic material having a higher thermal conductivity than the glass ceramic insulating layer. The glass ceramic insulating layer is provided on one main surface of the highly thermally conductive ceramic insulating layer or both main surfaces of the highly thermally conductive ceramic insulating layer directly and/or with a wiring layer interposed therebetween. When viewed in a direction perpendicular or substantially perpendicular to a main surface of the composite ceramic multilayer substrate, the composite ceramic multilayer substrate includes at least one heat generating element-mounting portion which is surrounded by the glass ceramic insulating layer and at which a heat generating element-mounting wiring line on the main surface of the highly thermally conductive ceramic insulating layer is exposed.

In a composite ceramic multilayer substrate having the above configuration, the highly thermally conductive ceramic insulating layer and the glass ceramic insulating layer are disposed in a single composite ceramic multilayer substrate in an integrated manner, which downsizes the entire composite ceramic multilayer substrate.

In a composite ceramic multilayer substrate having the above configuration, heat generating elements are able to be mounted in the heat generating element-mounting portion. Since the heat generating element-mounting wiring line is exposed at the heat generating element-mounting portion and the heat generating element-mounting wiring line is a wiring line on the main surface of the highly thermally conductive ceramic insulating layer, heat generated from the heat generating elements mounted in the heat generating element-mounting portion is conducted to the highly thermally conductive ceramic insulating layer through the heat generating element-mounting wiring line.

The highly thermally conductive ceramic insulating layer is made of a ceramic material having a high thermal conductivity. Therefore, heat from the heat generating element-mounting wiring line and the heat generating elements disposed above the highly thermally conductive ceramic insulating layer is able to be dissipated.

In a composite ceramic multilayer substrate according to a preferred embodiment of the present invention, the glass ceramic insulating layer is preferably provided on both main surfaces of the highly thermally conductive ceramic insulating layer directly and/or with a wiring layer interposed therebetween.

By disposing the glass ceramic insulating layer on both main surfaces of the highly thermally conductive ceramic insulating layer, the composite ceramic multilayer substrate is able to be used as a double-sided board.

In a composite ceramic multilayer substrate according to a preferred embodiment of the present invention, the glass ceramic insulating layer is preferably provided on both main surfaces of the highly thermally conductive ceramic insulating layer directly and/or with a wiring layer interposed therebetween, and a via electrode that electrically connects one main surface of the highly thermally conductive ceramic insulating layer to the other main surface is preferably provided. By disposing the via electrode, wiring layers in the glass ceramic insulating layers disposed on both main surfaces of the highly thermally conductive ceramic insulating layer are able to be electrically connected.

In a composite ceramic multilayer substrate according to a preferred embodiment of the present invention, a portion of the main surface of the highly thermally conductive ceramic insulating layer is preferably exposed at a periphery of the composite ceramic multilayer substrate. When a portion of the main surface of the highly thermally conductive ceramic insulating layer is exposed at a periphery of the composite ceramic multilayer substrate, heat is able to be dissipated from the exposed main surface of the highly thermally conductive ceramic insulating layer.

In a composite ceramic multilayer substrate according to a preferred embodiment of the present invention, a through hole used in screw fixing is preferably defined in the portion of the main surface of the highly thermally conductive ceramic insulating layer, the portion being exposed at the periphery of the composite ceramic multilayer substrate. When a through hole used in screw fixing is provided in the portion of the main surface of the highly thermally conductive ceramic insulating layer, the portion being exposed at the periphery of the composite ceramic multilayer substrate, the highly thermally conductive ceramic insulating layer is able to be fixed to a casing with a screw and thus heat is able to be directly dissipated from the highly thermally conductive ceramic insulating layer to the casing.

In a composite ceramic multilayer substrate according to a preferred embodiment of the present invention, an electrode to which a conductor used in power supply input/output is welded is preferably provided in a portion of a main surface of the highly thermally conductive ceramic insulating layer, the portion being exposed at the periphery of the composite ceramic multilayer substrate. When an electrode is provided in a portion of a main surface of the highly thermally conductive ceramic insulating layer, the portion being exposed at the periphery of the composite ceramic multilayer substrate, a conductor used in power supply input/output is able to be welded.

In a composite ceramic multilayer substrate according to a preferred embodiment of the present invention, the highly thermally conductive ceramic insulating layer is preferably partially disposed in a region including at least a portion immediately below the heat generating element-mounting portion in a main surface direction of the composite ceramic multilayer substrate. When the highly thermally conductive ceramic insulating layer is disposed in a region including a portion immediately below the heat generating element-mounting portion, the heat dissipation property is able to be locally improved.

In a composite ceramic multilayer substrate according to a preferred embodiment of the present invention, the heat generating element-mounting wiring line is preferably a Cu plate having a thickness of about 0.04 mm or more. The heat generating element-mounting wiring line having a thickness of about 0.04 mm or more is a thick wiring line, and it is difficult to achieve the thickness by using a cured product of a conductive paste containing a resin. That is, the wiring line is differentiated from a cured product of a conductive paste containing a resin. The Cu plate having a thickness of about 0.04 mm or more has a good heat dissipation property and thus is able to be particularly suitably used as a heat generating element-mounting wiring line to which heat from the heat generating element is conducted.

In a composite ceramic multilayer substrate according to a preferred embodiment of the present invention, the glass ceramic insulating layer is preferably directly provided on one main surface of the highly thermally conductive ceramic insulating layer or both main surfaces of the highly thermally conductive ceramic insulating layer, and a glass ceramic component contained in the glass ceramic insulating layer preferably diffuses into the highly thermally conductive ceramic insulating layer.

In this specification, the phrase "the glass ceramic insulating layer is directly provided on the main surface of the highly thermally conductive ceramic insulating layer" means that the highly thermally conductive ceramic insulating layer and the glass ceramic insulating layer are in direct contact with each other without a resin layer or a resin adhesive between the highly thermally conductive ceramic insulating layer and the glass ceramic insulating layer.

When a highly thermally conductive ceramic sintered body defining and functioning as the highly thermally conductive ceramic insulating layer and a multilayer body of glass ceramic green sheets defining and functioning as the glass ceramic insulating layer are pressure-fired, the glass ceramic component diffuses into the highly thermally conductive ceramic insulating layer. Consequently, a diffusion layer is provided at an interface between the highly thermally conductive ceramic insulating layer and the glass ceramic insulating layer, thus achieving high bonding strength. Therefore, the glass ceramic insulating layer is able to be directly disposed on the highly thermally conductive ceramic insulating layer without using a resin adhesive or the like.

In a composite ceramic multilayer substrate according to a preferred embodiment of the present invention, the highly thermally conductive ceramic insulating layer preferably has a higher heat capacity than the heat generating element-mounting wiring line.

In a composite ceramic multilayer substrate according to a preferred embodiment of the present invention, the highly thermally conductive ceramic insulating layer preferably has a larger total volume than the heat generating element-mounting wiring line. When the heat capacity of the highly thermally conductive ceramic insulating layer is higher than that of the heat generating element-mounting wiring line, the heat dissipation efficiency increases, which facilitates cooling of the heat generating element. When the total volume of the highly thermally conductive ceramic insulating layer is larger than that of the heat generating element-mounting wiring line, the heat capacity of the highly thermally conductive ceramic insulating layer is able to be made higher than that of the heat generating element-mounting wiring line.

In a composite ceramic multilayer substrate according to a preferred embodiment of the present invention, the glass ceramic insulating layer preferably has a total thickness larger than a thickness of the heat generating element-mounting wiring line. When the total thickness of the glass ceramic insulating layer is larger than the thickness of the heat generating element-mounting wiring line, the thermal conduction to elements mounted on the glass ceramic insulating layer is able to be reduced or prevented.

In a composite ceramic multilayer substrate according to a preferred embodiment of the present invention, a thermal conductivity of the ceramic material used in the highly thermally conductive ceramic insulating layer is preferably about three times or more higher than that of a glass ceramic contained in the glass ceramic insulating layer.

In a composite ceramic multilayer substrate according to a preferred embodiment of the present invention, the ceramic material used in the highly thermally conductive ceramic insulating layer has a thermal conductivity of about 15 $W \cdot m^{-1} \cdot K^{-1}$ or more, and the glass ceramic contained in the glass ceramic insulating layer has a thermal conductivity of about 5 $W \cdot m^{-1} \cdot K^{-1}$ or less. In the above configuration, heat from the heat generating element is efficiently dissipated from the highly thermally conductive ceramic insulating layer having a high thermal conductivity. On the other hand, heat from the heat generating element is not easily conducted toward the glass ceramic insulating layer having a low thermal conductivity and thus the thermal conduction to elements mounted on the glass ceramic insulating layer is reduced or prevented.

In this specification, the thermal conductivity of the ceramic material used in the highly thermally conductive ceramic insulating layer and the glass ceramic contained in the glass ceramic insulating layer is able to be measured by a laser flash method.

In a composite ceramic multilayer substrate according to a preferred embodiment of the present invention, the glass ceramic insulating layer preferably includes an inner wiring layer disposed therein, and the inner wiring layer is preferably disposed at a position higher than that of the heat generating element-mounting wiring line in a thickness direction of the highly thermally conductive ceramic insulating layer.

The material used in the inner wiring layer has a higher thermal conductivity than the glass ceramic used in the glass ceramic insulating layer. The inner wiring layer is disposed at a position higher than that of the heat generating element-mounting wiring line in a thickness direction of the highly thermally conductive ceramic insulating layer. In the glass ceramic insulating layer, a portion of which is in contact with the heat generating element-mounting wiring line and to which heat from the heat generating element-mounting wiring line is most easily conducted is a glass ceramic region in which the inner wiring layer is not disposed. Therefore, the thermal insulation effect on elements mounted on the glass ceramic insulating layer is able to be improved.

In a composite ceramic multilayer substrate according to a preferred embodiment of the present invention, a plurality of heat generating element-mounting portions including a first heat generating element-mounting portion and a second heat generating element-mounting portion are preferably provided on the heat generating element-mounting wiring line, and a partition wall containing the same glass ceramic as the glass ceramic insulating layer is preferably disposed between the first heat generating element-mounting portion and the second heat generating element-mounting portion. In the above configuration, heating of the heat generating elements due to radiant heat produced by the heat generating elements is able to be reduced or prevented by the partition wall. The partition wall is able to be defined together with the glass ceramic insulating layer, which does not require an additional process even if the partition wall is provided.

In a composite ceramic multilayer substrate according to a preferred embodiment of the present invention, a portion of the glass ceramic insulating layer is also preferably disposed in a portion that covers a periphery of the heat generating element-mounting wiring line. When a periphery of the heat generating element-mounting wiring line is covered with a portion of the glass ceramic insulating layer, the adhesiveness between the heat generating element-mounting wiring line and the highly thermally conductive ceramic insulating layer is able to be improved.

In a composite ceramic multilayer substrate according to a preferred embodiment of the present invention, a difference in average thermal expansion coefficient at about 30° C. to about 300° C. between the highly thermally conductive ceramic insulating layer and the glass ceramic insulating layer is preferably about 3.5 ppm·K$^{-1}$ or less. When the difference in average thermal expansion coefficient between the highly thermally conductive ceramic insulating layer and the glass ceramic insulating layer is within the above predetermined range, damage caused due to the difference in thermal expansion coefficient between the highly thermally conductive ceramic insulating layer and the glass ceramic insulating layer is able to be reduced or prevented even at a high operating temperature of about 200° C. or higher.

In a composite ceramic multilayer substrate according to a preferred embodiment of the present invention, the heat generating element-mounting wiring line preferably contains silver or copper, and the ceramic material of the highly thermally conductive ceramic insulating layer preferably contains silicon nitride, aluminum nitride, alumina, or silicon carbide. The metal and ceramic that are materials for the heat generating element-mounting wiring line and the highly thermally conductive ceramic insulating layer are a metal and a ceramic each having a high thermal conductivity. Therefore, they are suitable as materials for the heat generating element-mounting wiring line and the highly thermally conductive ceramic insulating layer that conduct heat from the heat generating element.

The heat generating element-mounting wiring line also preferably contains the silver or the copper in an amount of about 98 wt % or more. A silver content of about 98 wt % or more or a copper content of about 98 wt % or more means that the heat generating element-mounting wiring line is made of a pure or substantially pure metal, which is definitely differentiated from a cured product of a conductive paste containing a resin.

In a composite ceramic multilayer substrate according to a preferred embodiment of the present invention, the glass ceramic insulating layer preferably contains a SiO$_2$—CaO—Al$_2$O$_3$—B$_2$O$_3$ glass ceramic or a SiO$_2$—MgO—Al$_2$O$_3$—B$_2$O$_3$ glass ceramic. This is because these glass ceramics are ceramics that is able to be fired at a relatively low temperature that is the sintering temperature of the wiring layer made of copper or silver, which allows simultaneous sintering with the wiring layer made of copper or silver.

A composite ceramic multilayer substrate according to another preferred embodiment of the present invention includes a heat generating element-mounting wiring line, a glass ceramic insulating layer, and a highly thermally conductive ceramic insulating layer made of a ceramic material having a higher thermal conductivity than a glass ceramic contained in the glass ceramic insulating layer. The heat generating element-mounting wiring line is disposed on the highly thermally conductive ceramic insulating layer, and the glass ceramic insulating layer is directly disposed on the highly thermally conductive ceramic insulating layer. In the composite ceramic multilayer substrate having the above configuration, the highly thermally conductive ceramic insulating layer and the glass ceramic insulating layer are disposed in a single composite ceramic multilayer substrate in an integrated manner, which downsizes the entire composite ceramic multilayer substrate. In the composite ceramic multilayer substrate having the above configuration, a heat generating element is able to be mounted on the heat generating element-mounting wiring line.

Since the heat generating element-mounting wiring line is a wiring line on the highly thermally conductive ceramic insulating layer, heat generated from the heat generating element mounted on the heat generating element-mounting wiring line is conducted to the highly thermally conductive ceramic insulating layer. The highly thermally conductive ceramic insulating layer is made of a ceramic material having a high thermal conductivity. Therefore, heat from the heat generating element-mounting wiring line and the heat generating elements disposed above the highly thermally conductive ceramic insulating layer is able to be dissipated.

In a composite ceramic multilayer substrate according to another preferred embodiment of the present invention, a glass ceramic component contained in the glass ceramic insulating layer preferably diffuses into the highly thermally conductive ceramic insulating layer. The glass ceramic insulating layer preferably has a larger thickness than the heat generating element-mounting wiring line.

The ceramic material of the highly thermally conductive ceramic insulating layer preferably has a thermal conductivity of about 15 W·m$^{-1}$·K$^{-1}$ or more, and the glass ceramic contained in the glass ceramic insulating layer preferably has a thermal conductivity of about 5 W·m$^{-1}$·K$^{-1}$ or less.

A portion of the glass ceramic insulating layer is also preferably disposed in a portion that covers a periphery of the heat generating element-mounting wiring line.

The heat generating element-mounting wiring line preferably contains silver or copper, and the ceramic material of the highly thermally conductive ceramic insulating layer preferably contains silicon nitride, aluminum nitride, alumina, or silicon carbide.

The glass ceramic insulating layer preferably contains a SiO$_2$—CaO—Al$_2$O$_3$—B$_2$O$_3$ glass ceramic or a SiO$_2$—MgO—Al$_2$O$_3$—B$_2$O$_3$ glass ceramic.

A heat generating element-mounting module according to a preferred embodiment of the present invention includes a composite ceramic multilayer substrate according to a preferred embodiment of the present invention and a heat generating element mounted in the heat generating element-mounting portion of the composite ceramic multilayer substrate. Heat from the heat generating element mounted on the composite ceramic multilayer substrate according to a preferred embodiment of the present invention is able to be dissipated through the heat generating element-mounting wiring line disposed in the heat generating element-mounting portion and the highly thermally conductive ceramic insulating layer.

In a heat generating element-mounting module according to a preferred embodiment of the present invention, the heat generating element is preferably at least one element selected from the group consisting of a power element, a control element, a passive component, and a light-emitting element.

A composite ceramic multilayer substrate according to a preferred embodiment of the present invention is suitable to dissipate heat generated from the heat generating element.

The heat generating element-mounting module according to a preferred embodiment of the present invention is a module having a good heat dissipation property.

In a heat generating element-mounting module according to a preferred embodiment of the present invention, the power element is preferably an element made of a wide band gap semiconductor. The wide band gap semiconductor is preferably silicon carbide or gallium nitride.

In the case where the power element is an element capable of operating at about 200° C. or higher and the power element is actually operated at about 200° C. or higher, heat generated during the operation of the power element defining the power supply circuit is conducted to other elements such as heat generating element-controlling elements. However, since the heat generating element-mounting module according to a preferred embodiment of the present invention has a configuration that solves such a problem, an element made of a wideband band gap semiconductor capable of operating at about 200° C. or higher is particularly suitably used as the power element.

In a heat generating element-mounting module according to a preferred embodiment of the present invention, the light-emitting element is preferably at least one element selected from the group consisting of an LED, an organic EL element, an LIDAR element, an RADAR element, and a millimeter-wave element. Since these light-emitting elements are elements having a large amount of heat dissipation, the heat generating element-mounting module according to a preferred embodiment of the present invention obtained by mounting these elements on the composite ceramic multilayer substrate according to a preferred embodiment of the present invention is a module having a good heat dissipation property.

In a heat generating element-mounting module according to a preferred embodiment of the present invention, the heat generating element-mounting wiring line and the glass ceramic insulating layer are preferably disposed on the same plane of the highly thermally conductive ceramic insulating layer, and the heat generating element is preferably disposed on a side of the heat generating element-mounting wiring line opposite to a side on which the highly thermally conductive ceramic insulating layer is disposed. A heat generating element-controlling element that controls driving of the heat generating element is preferably disposed on a side of the glass ceramic insulating layer opposite to a side on which the highly thermally conductive ceramic insulating layer is disposed, and the glass ceramic insulating layer preferably has a total thickness larger than a sum of a thickness of the heat generating element-mounting wiring line and a height of the heat generating element in a thickness direction of the highly thermally conductive ceramic insulating layer.

When the heat generating element-mounting wiring line and the glass ceramic insulating layer are disposed on the same plane of the highly thermally conductive ceramic insulating layer, the size of the heat generating element-mounting module is able to be decreased. When the total thickness of the glass ceramic insulating layer is larger than the sum of the thickness of the heat generating element-mounting wiring line and the height of the heat generating element in a thickness direction of the highly thermally conductive ceramic insulating layer, the position of the heat generating element-controlling element disposed on the glass ceramic insulating layer is higher than that of the heat generating element. This makes it difficult to conduct radiant heat from the heat generating element to the heat generating element-controlling element.

In a heat generating element-mounting module according to a preferred embodiment of the present invention, the glass ceramic insulating layer is preferably interposed between the heat generating element and the heat generating element-controlling element. When the glass ceramic insulating layer having a low thermal conductivity is interposed between the heat generating element and the heat generating element-controlling element, radiant heat from the heat generating element is able to be prevented from being conducted to the heat generating element-controlling element with more certainty.

In a heat generating element-mounting module according to a preferred embodiment of the present invention, the heat generating element-mounting portion is preferably filled with a sealing resin to seal the heat generating element with the sealing resin. The total thickness of the glass ceramic insulating layer is larger than the sum of the thickness of the heat generating element-mounting wiring line and the height of the heat generating element in a thickness direction of the highly thermally conductive ceramic insulating layer, which means that the heat generating element-mounting portion is a space surrounded by the glass ceramic insulating layer. The glass ceramic insulating layer that surrounds the heat generating element-mounting portion defines and functions as a dam during filling with the sealing resin. This allows the heat generating element to be sealed with a minimum amount of resin.

A heat generating element-mounting module according to a preferred embodiment of the present invention includes a composite ceramic multilayer substrate according to a preferred embodiment of the present invention and a heat generating element mounted on the heat generating element-mounting wiring line of the composite ceramic multilayer substrate. Heat from the heat generating element mounted on the composite ceramic multilayer substrate according to a preferred embodiment of the present invention is able to be dissipated through the heat generating element-mounting wiring line and the highly thermally conductive ceramic insulating layer.

In a heat generating element-mounting module according to a preferred embodiment of the present invention, the heat generating element-mounting wiring line and the glass ceramic insulating layer are preferably disposed on the same plane of the highly thermally conductive ceramic insulating layer, and the heat generating element is preferably disposed on a side of the heat generating element-mounting wiring line opposite to a side on which the highly thermally conductive ceramic insulating layer is disposed. A heat generating element-controlling element that controls driving of the heat generating element is preferably disposed on a side of the glass ceramic insulating layer opposite to a side on which the highly thermally conductive ceramic insulating layer is disposed, and the glass ceramic insulating layer preferably has a thickness larger than a sum of a thickness of the heat generating element-mounting wiring line and a height of the heat generating element in a thickness direction of the highly thermally conductive ceramic insulating layer.

A heat generating element-mounting portion defining and functioning as a space in which the heat generating element is disposed is preferably filled with a sealing resin to seal the heat generating element with the sealing resin. The heat generating element is preferably at least one element selected from the group consisting of a power element, a control element, a passive component, and a light-emitting element.

A method of producing a composite ceramic multilayer substrate according to a preferred embodiment of the present invention includes a step of forming a glass ceramic insulating layer on one main surface of a highly thermally conductive ceramic insulating layer made of a ceramic material having a higher thermal conductivity than a glass ceramic contained in the glass ceramic insulating layer or both main surfaces of the highly thermally conductive ceramic insulating layer directly and/or with a wiring layer interposed therebetween, and a step of forming a heat generating element-mounting wiring line on the highly thermally conductive ceramic insulating layer. When the composite ceramic multilayer substrate is viewed in a direction perpendicular to a main surface of the composite ceramic multilayer substrate, at least one heat generating element-mounting portion is formed which is surrounded by the glass ceramic insulating layer and at which the heat generating element-mounting wiring line on the main surface of the highly thermally conductive ceramic insulating layer is exposed.

By forming the heat generating element-mounting wiring line on the highly thermally conductive ceramic insulating layer and further forming the glass ceramic insulating layer on the highly thermally conductive ceramic insulating layer, the composite ceramic multilayer substrate according to a preferred embodiment of the present invention is able to be produced.

In a method of producing a composite ceramic multilayer substrate according to a preferred embodiment of the present invention, the glass ceramic insulating layer is preferably directly formed on the highly thermally conductive ceramic insulating layer by pressure-firing a highly thermally conductive ceramic sintered body to define and function as the highly thermally conductive ceramic insulating layer and a multilayer body of glass ceramic green sheets to define and function as the glass ceramic insulating layer. In this method, a glass ceramic component contained in the glass ceramic insulating layer is able to be diffused into the highly thermally conductive ceramic insulating layer. Thus, a diffusion layer is formed at an interface between the highly thermally conductive ceramic insulating layer and the glass ceramic insulating layer, thus achieving high bonding strength.

In this method, the pressure firing is preferably performed at a pressure of about 0.1 kgf/cm$^2$ or more and about 30.0 kgf/cm$^2$ or less. A pressure of about 0.1 kgf/cm$^2$ or more is suitable for forming the diffusion layer. At a pressure of about 30.0 kgf/cm$^2$ or less, the highly thermally conductive ceramic insulating layer or the glass ceramic insulating layer is prevented from being broken.

A method of producing a composite ceramic multilayer substrate according to a preferred embodiment of the present invention includes a step of directly forming a glass ceramic insulating layer on a highly thermally conductive ceramic insulating layer made of a ceramic material having a higher thermal conductivity than a glass ceramic contained in the glass ceramic insulating layer, and a step of forming a heat generating element-mounting wiring line on the highly thermally conductive ceramic insulating layer. By directly forming the glass ceramic insulating layer on the highly thermally conductive ceramic insulating layer and forming the heat generating element-mounting wiring line on the highly thermally conductive ceramic insulating layer, the composite ceramic multilayer substrate according to a preferred embodiment of the present invention is able to be produced.

In a method of producing a composite ceramic multilayer substrate according to a preferred embodiment of the present invention, the glass ceramic insulating layer is preferably directly formed on the highly thermally conductive ceramic insulating layer by pressure-firing a highly thermally conductive ceramic sintered body to define and function as the highly thermally conductive ceramic insulating layer and a multilayer body of glass ceramic green sheets to define and function as the glass ceramic insulating layer. The pressure firing is preferably performed at a pressure of about 0.1 kgf/cm$^2$ or more and about 30.0 kgf/cm$^2$ or less.

According to preferred embodiments of the present invention, it is possible to provide composite ceramic multilayer substrates that are each a circuit board including, in an integrated manner, a heat generating element-mounting wiring line on which heat generating elements are to be mounted and a wiring layer that is able to be used as a control circuit.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a sectional view schematically illustrating an example of a composite ceramic multilayer substrate according to a preferred embodiment of the present invention.

FIG. 2A is an electron micrograph obtained by capturing an interface between a highly thermally conductive ceramic insulating layer and a glass ceramic insulating layer using a scanning transmission electron microscope (STEM). For the electron micrograph in FIG. 2A, FIG. 2B is an image illustrating the elemental analysis result of aluminum, FIG. 2C is an image illustrating the elemental analysis result of silicon, and FIG. 2D is an image illustrating the elemental analysis result of calcium.

DETAILED DESCRIPTION OF THE PREFERRED EMBODIMENTS

Figure 3:
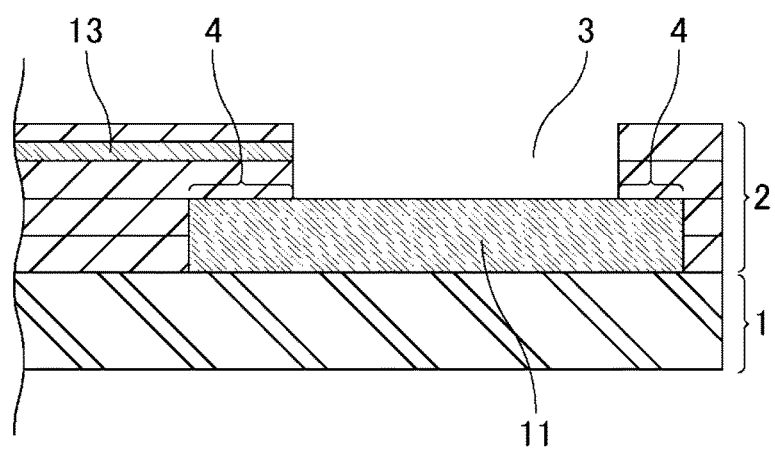
FIG. 3 is a sectional view schematically illustrating a portion of the composite ceramic multilayer substrate according to a preferred embodiment of the present invention.

Hereafter, composite ceramic multilayer substrates, heat generating element-mounting modules, and methods of producing the composite ceramic multilayer substrates according to preferred embodiments of the present invention will be described in detail with reference to the drawings.

The present invention is not limited to the following preferred embodiments, and any modification is able to be appropriately made without departing from the scope of the present invention. A combination of two or more individual desired configurations of the composite ceramic multilayer substrates, the heat generating element-mounting modules, and the methods of producing the composite ceramic multilayer substrate according to preferred embodiments of the present invention below is also within the scope of the present invention.

FIG. 1 is a sectional view schematically illustrating an example of a composite ceramic multilayer substrate according to a preferred embodiment of the present invention.

FIG. 1 illustrates a composite ceramic multilayer substrate 100. In the composite ceramic multilayer substrate 100 illustrated in FIG. 1, a heat generating element-mounting wiring line 11 is disposed on a main surface 1a of a highly thermally conductive ceramic insulating layer 1 and a glass ceramic insulating layer 2 is disposed on the main surface 1a of the highly thermally conductive ceramic insulating layer 1. That is, the heat generating element-mounting wiring line 11 and the glass ceramic insulating layer 2 are disposed on the same plane of the highly thermally conductive ceramic insulating layer 1.

The glass ceramic insulating layer 2 is preferably a multilayer insulating layer obtained by laminating glass ceramic insulating layers 2A, 2B, 2C, 2D, 2E, 2F, 2G, and 2H.

In the composite ceramic multilayer substrate 100, a heat generating element is disposed on a surface 11a of the heat generating element-mounting wiring line 11 opposite to a surface 11b on which the highly thermally conductive ceramic insulating layer 1 is disposed.

An element, such as a heat generating element-controlling element, for example, is able to be mounted on a surface 2a of the glass ceramic insulating layer 2 opposite to a surface 2b on which the highly thermally conductive ceramic insulating layer 1 is disposed.

The highly thermally conductive ceramic insulating layer 1 is preferably a sintered ceramic substrate. The ceramic material of the highly thermally conductive ceramic insulating layer 1 is preferably, for example, silicon nitride, aluminum nitride, alumina, or silicon carbide.

The thermal conductivity of the ceramic material of the highly thermally conductive ceramic insulating layer is higher than that of a glass ceramic contained in the glass ceramic insulating layer. The thermal conductivity of the ceramic material of the highly thermally conductive ceramic insulating layer is preferably about 15 $W \cdot m^{-1} \cdot K^{-1}$ or more and more preferably about 30 $W \cdot m^{-1} \cdot K^{-1}$ or more, for example. The thermal conductivity is preferably about 300 $W \cdot m^{-1} \cdot K^{-1}$ or less, for example.

When the thermal conductivity of the ceramic material of the highly thermally conductive ceramic insulating layer is about 15 $W \cdot m^{-1} \cdot K^{-1}$ or more, heat generated from the heat generating element is able to be efficiently dissipated.

The specific heat of the highly thermally conductive ceramic insulating layer is preferably about 500 $J \cdot (kg \cdot ° C.)^{-1}$ or more and 900 $J \cdot (kg \cdot ° C.)^{-1}$ or less, for example.

The average thermal expansion coefficient of the highly thermally conductive ceramic insulating layer at about 30° C. to about 300° C. is preferably about 2.0 $ppm \cdot K^{-1}$ or more and about 9.0 $ppm \cdot K^{-1}$ or less, for example.

The fracture toughness of the highly thermally conductive ceramic insulating layer is preferably about 4 $MPa \cdot m^{1/2}$ or more and about 7 $MPa \cdot m^{1/2}$ or less, for example. The flexural strength (three-point bending strength) is preferably about 300 MPa or more and about 550 MPa or less, for example.

Such characteristics improve the reliability of the composite ceramic multilayer substrate in an environment in which the composite ceramic multilayer substrate undergoes vibration or impact. Glass ceramics used for the glass ceramic insulating layer generally have a fracture toughness of less than about 2 $MPa \cdot m^{1/2}$ and are vulnerable to vibration and impact. This sometimes poses a problem in that when a ceramic multilayer substrate whose circuit board is made of only a glass ceramic insulating layer is incorporated into, for example, onboard electrical apparatuses that undergo vibration or impact, the reliability cannot be ensured. This problem is able to be addressed by integrating the glass ceramic insulating layer and the highly thermally conductive ceramic insulating layer having high fracture toughness and high flexural strength.

The highly thermally conductive ceramic insulating layer is preferably, for example, a highly thermally conductive ceramic insulating layer that is made of sintered 96% alumina (or about 96% alumina) and has a thickness of about 0.5 mm, a thermal conductivity of about 21 $W·m^{-1}·K^{-1}$, an average thermal expansion coefficient at about 30° C. to about 300° C. of about 7.8 $ppm·K^{-1}$, a flexural strength (three-point bending strength) of about 350 MPa, and a fracture toughness of about 5 $MPa·m^{1/2}$.

The heat generating element-mounting wiring line 11 is a wiring line on which a heat generating element is disposed.

The heat generating element-mounting wiring line is preferably a wiring line containing silver or copper and particularly preferably a wiring line containing silver or copper in an amount of about 98 wt % or more, for example. This means that preferably, silver is contained in an amount of about 98 wt % or more or copper is contained in an amount of about 98 wt % or more. That is, the heat generating element-mounting wiring line is preferably made of a pure or substantially pure metal and is definitely differentiated from a cured product of a conductive paste containing components other than metals.

When the heat generating element-mounting wiring line is made of a pure or substantially pure metal, the thermal conductivity of the heat generating element-mounting wiring line increases, which is suitable for thermal conduction from the heat generating element to the highly thermally conductive ceramic insulating layer.

The thermal conductivity of the heat generating element-mounting wiring line is preferably about 300 $W·m^{-1}·K^{-1}$ or more and about 500 $W·m^{-1}·K^{-1}$ or less, for example.

The thickness of the heat generating element-mounting wiring line is preferably about 0.04 mm or more, for example. The heat generating element-mounting wiring line is preferably a Cu plate having a thickness of about 0.04 mm or more, for example.

The heat generating element-mounting wiring line having a thickness of about 0.04 mm or more is a thick wiring line, and it is difficult to achieve the thickness by using a cured product of a conductive paste containing a resin. That is, the wiring line is definitely differentiated from a cured product of a conductive paste containing a resin.

When the thickness of the heat generating element-mounting wiring line is large, the resistance decreases. Thus, the wiring line is suitable as a wiring line applicable to a power supply circuit in a power conversion section having a high current-carrying capacity.

The Cu plate having a thickness of about 0.04 mm or more has a good heat dissipation property and thus is able to be particularly suitably used as a heat generating element-mounting wiring line to which heat from the heat generating element is conducted.

The specific heat of the heat generating element-mounting wiring line is preferably about 300 $J·(kg·°C.)^{-1}$ or more and about 500 $J·(kg·°C.)^{-1}$ or less, for example.

The heat capacity of the highly thermally conductive ceramic insulating layer is preferably higher than that of the heat generating element-mounting wiring line. The total volume of the highly thermally conductive ceramic insulating layer is preferably larger than that of the heat generating element-mounting wiring line.

When the heat capacity of the highly thermally conductive ceramic insulating layer is higher than that of the heat generating element-mounting wiring line, the heat dissipation efficiency increases, which facilitates cooling of the heat generating element.

When the total volume of the highly thermally conductive ceramic insulating layer is larger than that of the heat generating element-mounting wiring line, the heat capacity of the highly thermally conductive ceramic insulating layer is able to be made higher than that of the heat generating element-mounting wiring line.

The glass ceramic insulating layer 2 is a layer that contains wiring layers and is preferably formed by, for example, laminating a plurality of glass ceramic insulating layers. The glass ceramic insulating layer is able to be made of a low-temperature-sintering ceramic material.

The low-temperature-sintering ceramic material is a ceramic material that is able to be sintered at a firing temperature of about 1000° C. or lower and is able to be sintered together with silver or copper preferably used as a metal material of inner conductor layers.

The low-temperature-sintering ceramic material preferably contains a $SiO_2$—$CaO$—$Al_2O_3$—$B_2O_3$ glass ceramic or a $SiO_2$—$MgO$—$Al_2O_3$—$B_2O_3$ glass ceramic, for example.

The glass ceramic insulating layer is preferably directly disposed on the highly thermally conductive ceramic insulating layer. Referring to FIG. 1, this corresponds to the direct contact between the main surface 1a of the highly thermally conductive ceramic insulating layer 1 and the surface 2b of the glass ceramic insulating layer 2 (a lower surface of a lowermost glass ceramic layer 2A) without a resin layer or a resin adhesive.

The glass ceramic component contained in the glass ceramic insulating layer preferably diffuses into the highly thermally conductive ceramic insulating layer. The formation of a diffusion layer at an interface between the highly thermally conductive ceramic insulating layer and the glass ceramic insulating layer achieves high bonding strength. Therefore, the glass ceramic insulating layer is able to be directly disposed on the highly thermally conductive ceramic insulating layer without using a resin adhesive or the like.

FIG. 2A is an electron micrograph obtained by capturing the interface between the highly thermally conductive ceramic insulating layer and the glass ceramic insulating layer using a scanning transmission electron microscope (STEM). For the electron micrograph in FIG. 2A, FIG. 2B is an image illustrating the elemental analysis result of aluminum, FIG. 2C is an image illustrating the elemental analysis result of silicon, and FIG. 2D is an image illustrating the elemental analysis result of calcium.

The highly thermally conductive ceramic insulating layer used in this capturing is made of a 96% alumina sintered body, and the glass ceramic insulating layer is obtained by sintering a mixed powder of a $SiO_2$—$CaO$—$Al_2O_3$—$B_2O_3$ glass powder and an alumina powder.

FIG. 2A illustrates the interface between the main surface 1a of the highly thermally conductive ceramic insulating layer 1 and the surface 2b of the glass ceramic insulating layer 2. As is clear from FIGS. 2B to 2D, aluminum, silicon, and calcium are respectively distributed at particular widths from the interface toward the highly thermally conductive ceramic insulating layer.

The highly thermally conductive ceramic insulating layer used in this capturing does not contain silicon or calcium. Therefore, the distribution of silicon and calcium in FIGS. 2C and 2D shows that a glass ceramic component diffuses into the highly thermally conductive ceramic insulating layer and a diffusion layer is provided at the interface.

The thermal conductivity of the glass ceramic contained in the glass ceramic insulating layer is lower than that of the ceramic material of the highly thermally conductive ceramic insulating layer. The thermal conductivity of the glass ceramic contained in the glass ceramic insulating layer is preferably about 5 $W·m^{-1}·K^{-1}$ or less and more preferably about 3.5 $W·m^{-1}·K^{-1}$ or less, for example. The thermal conductivity is preferably about 1.5 $W·m^{-1}·K^{-1}$ or more, for example.

When the thermal conductivity of the glass ceramic contained in the glass ceramic insulating layer is about 5 $W·m^{-1}·K^-$ or less, heat is not easily conducted and an increase in temperature of elements mounted on the glass ceramic insulating layer is reduced or prevented when the heat generating element generates heat.

For the relationship with the thermal conductivity of the ceramic material of the highly thermally conductive ceramic insulating layer, the thermal conductivity of the ceramic material of the highly thermally conductive ceramic insulating layer is preferably, for example, about three times or more higher than that of the glass ceramic contained in the glass ceramic insulating layer.

In the above configuration, heat from the heat generating element is efficiently dissipated from the highly thermally conductive ceramic insulating layer having a high thermal conductivity. On the other hand, heat from the heat generating element is not easily conducted toward the glass ceramic insulating layer having a low thermal conductivity and thus the thermal conduction to elements mounted on the glass ceramic insulating layer is reduced or prevented.

The total thickness of the glass ceramic insulating layer is preferably larger than the thickness of the heat generating element-mounting wiring line.

The total thickness of the glass ceramic insulating layer refers to a sum of thicknesses of the plurality of glass ceramic insulating layers.

When the total thickness of the glass ceramic insulating layer is larger than the thickness of the heat generating element-mounting wiring line, the thermal conduction to elements mounted on the glass ceramic insulating layer is able to be reduced or prevented.

The average thermal expansion coefficient of the glass ceramic insulating layer at about 30° C. to about 300° C. is preferably about 3.5 $ppm·K^{-1}$ or more and about 10.5 $ppm·K^{-1}$ or less, for example.

The thermal expansion coefficient of the glass ceramic insulating layer is defined as a thermal expansion coefficient of a glass ceramic serving as a material of glass ceramic layers constituting the glass ceramic insulating layer.

The difference in average thermal expansion coefficient at about 30° C. to about 300° C. between the highly thermally conductive ceramic insulating layer and the glass ceramic insulating layer is preferably about 3.5 $ppm·K^{-1}$ or less, for example. This provides a composite ceramic multilayer substrate in which mounting failure does not readily occur and which has high reliability in a thermal shock environment. If the difference in average thermal expansion coefficient is more than about 3.5 $ppm·K^{-1}$, the composite ceramic multilayer substrate may be damaged because of the difference in thermal expansion coefficient and heat generating elements and other elements may be subjected to mounting failure. Furthermore, if the difference in average thermal expansion coefficient is more than about 3.5 $ppm·K^{-1}$, stress is repeatedly generated because of the difference in thermal expansion coefficient when the composite ceramic multilayer substrate on which heat generating elements and other elements have been mounted is exposed to a thermal shock environment. Consequently, the heat generating elements and other elements may be broken or the mounting portions may be broken.

Examples of the combination of the highly thermally conductive ceramic insulating layer and the glass ceramic insulating layer that achieves a difference in average thermal expansion coefficient at about 30° C. to about 300° C. of about 3.5 $ppm·K^{-1}$ or less include a combination of a highly thermally conductive ceramic insulating layer made of alumina and a glass ceramic insulating layer made of a $SiO_2$—$CaO$—$Al_2O_3$—$B_2O_3$ glass ceramic and a combination of a highly thermally conductive ceramic insulating layer made of aluminum nitride or silicon nitride and a glass ceramic insulating layer made of a $SiO_2$—$MgO$—$Al_2O_3$—$B_2O_3$ glass ceramic.

The glass ceramic insulating layer preferably includes wiring layers. The wiring layers preferably include inner wiring layers electrically connected to elements mounted on the glass ceramic insulating layer.

In the composite ceramic multilayer substrate 100 illustrated in FIG. 1, the inner wiring layers 13 are disposed in each of the glass ceramic insulating layers and together define a multilayer wiring line.

The inner wiring layers 13 are electrically connected to surface-layer wiring lines 15 serving as wiring lines of an uppermost surface layer through via conductors 14 that electrically connect the inner wiring layers 13 to each other. Since elements are able to be mounted on the surface-layer wiring lines 15, the elements mounted on the surface-layer wiring lines 15 are electrically connected to the inner wiring layers 13. The inner wiring layers 13, the via conductors 14, and the surface-layer wiring lines 15 define wiring layers included in the glass ceramic insulating layer.

A power supply wiring line 12 may be disposed in the glass ceramic insulating layer 2. The power supply wiring line 12 is electrically connected to the heat generating element through the heat generating element-mounting wiring line 11.

The inner wiring layers, the via conductors, and the surface-layer wiring lines are preferably made of, for example, a metal containing silver or copper as a main component and having a high electrical conductivity. The use of a metal having a low electrical conductivity increases the electrical resistance and thus increases the transmission loss, which may readily cause malfunction.

The inner wiring layers preferably have a thickness of about 0.01 mm or less, for example. This prevents formation of irregularities on the uppermost surface of the glass ceramic insulating layer, which makes it difficult to cause mounting failure of elements mounted on the glass ceramic insulating layer.

The inner wiring layers are preferably disposed at positions higher than that of the heat generating element-mounting wiring line in a thickness direction of the highly thermally conductive ceramic insulating layer. This will be described with reference to FIG. 1.

In the composite ceramic multilayer substrate 100 illustrated in FIG. 1, the inner wiring layers 13 are not disposed in the glass ceramic insulating layers 2A and 2B located at the same level as the heat generating element-mounting wiring line 11. The inner wiring layer 13a disposed in the glass ceramic insulating layer 2C located at a position higher than that of the heat generating element-mounting wiring line 11 is an inner wiring layer 13 located at the lowest position. In this case, it may be said that the inner wiring layers are disposed at positions higher than that of the heat generating element-mounting wiring line in a thickness direction of the highly thermally conductive ceramic insulating layer.

In the glass ceramic insulating layer 2, portions of which are in contact with the heat generating element-mounting wiring line 11 and to which heat from the heat generating element-mounting wiring line is most easily conducted are the glass ceramic insulating layers 2A and 2B in which the inner wiring layers 13 are not disposed. This improves the thermal insulation effect on elements mounted on the glass ceramic insulating layer.

FIG. 1 illustrates a heat generating element-mounting portion 3 provided in the composite ceramic multilayer substrate 100.

The heat generating element-mounting portion 3 includes a bottom at which the heat generating element-mounting wiring line 11 is present and is surrounded by the glass ceramic insulating layer 2. The heat generating element-mounting portion 3 is partially surrounded by a partition wall 41 containing the same glass ceramic as the glass ceramic insulating layer 2.

The heat generating element-mounting portion 3 is a space in which heat generating elements are disposed. When the composite ceramic multilayer substrate is viewed in a direction perpendicular or substantially perpendicular to the main surface, the space is able to be regarded as a cavity surrounded by the glass ceramic insulating layer 2 and including a bottom at which the heat generating element-mounting wiring line 11 is exposed.

Even when the heat generating element-mounting portion is partially surrounded by a partition wall containing the same glass ceramic as the glass ceramic insulating layer, the heat generating element-mounting portion may be regarded as being surrounded by the glass ceramic insulating layer.

When heat generating elements are mounted in the heat generating element-mounting portion, heat generated in the heat generating elements is able to be efficiently conducted to the back surface of the heat generating element-mounting wiring line through only the heat generating element-mounting wiring line and the highly thermally conductive ceramic insulating layer without the glass ceramic insulating layer, which can improve the heat dissipation property.

In the composite ceramic multilayer substrate 100 illustrated in FIG. 1, a first heat generating element-mounting portion 3a and a second heat generating element-mounting portion 3b are provided on the heat generating element-mounting wiring line 11. A partition wall 41 containing the same glass ceramic as the glass ceramic insulating layer 2 is preferably disposed between the first heat generating element-mounting portion 3a and the second heat generating element-mounting portion 3b.

When a plurality of heat generating elements are disposed and partition walls are disposed between the heat generating elements, heating of the heat generating elements due to radiant heat produced by the heat generating elements is able to be reduced or prevented by the partition walls.

The partition walls are able to be formed together with the glass ceramic insulating layer, which does not require an additional process even if the partition walls are provided.

FIG. 3 is a sectional view schematically illustrating a portion of the composite ceramic multilayer substrate.

FIG. 3 is a diagram used to describe that in the composite ceramic multilayer substrate, a portion of the glass ceramic insulating layer is also disposed in portions that cover the peripheries of the heat generating element-mounting wiring line.

FIG. 3 illustrates peripheries 4 of the heat generating element-mounting wiring line 11 and also illustrates covering of the peripheries 4 of the heat generating element-mounting wiring line 11 with the glass ceramic insulating layer 2.

In the case where the glass ceramic insulating layer 2 covers the peripheries 4 of the heat generating element-mounting wiring line 11, when the composite ceramic multilayer substrate is viewed from above in the vertical direction, the glass ceramic insulating layer covers the peripheries of the heat generating element-mounting wiring line in a frame shape. In this positional relationship, the glass ceramic insulating layer defines and functions as a framing portion that fixes the peripheries of the heat generating element-mounting wiring line. This makes it difficult for the heat generating element-mounting wiring line to peel off from the highly thermally conductive ceramic insulating layer.

Therefore, the composite ceramic multilayer substrate has a structure more durable to vibration and impact.

Next, a heat generating element-mounting module according to the present invention will be described.

Figure 4:
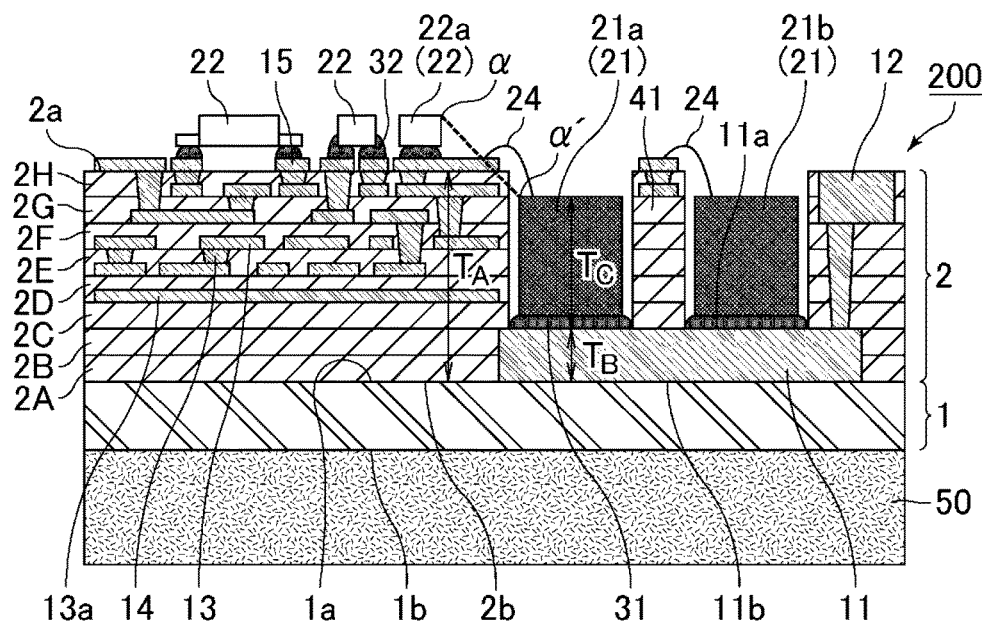
FIG. 4 is a sectional view schematically illustrating an example of a heat generating element-mounting module according to a preferred embodiment of the present invention obtained by mounting heat generating elements in the heat generating element-mounting portions of the composite ceramic multilayer substrate according to a preferred embodiment of the present invention in FIG. 1.

FIG. 4 is a sectional view schematically illustrating an example of a heat generating element-mounting module obtained by mounting heat generating elements in the heat generating element-mounting portions of the composite ceramic multilayer substrate according to a preferred embodiment of the present invention in FIG. 1.

In a heat generating element-mounting module 200 illustrated in FIG. 4, heat generating elements 21 are disposed on a surface 11a of the heat generating element-mounting wiring line opposite to a surface 11b on which the highly thermally conductive ceramic insulating layer 1 is disposed. The heat generating elements 21 are joined to the heat generating element-mounting wiring line 11 preferably using a joining material 31 such as, for example, solder or a nano-silver sintered material.

The heat generating element-mounting module 200 preferably includes two heat generating elements 21 (heat generating elements 21a and 21b) and a partition wall 41 containing the same glass ceramic as the glass ceramic insulating layer 2 and disposed between the heat generating elements 21a and 21b.

A casing 50 is disposed on a main surface 1b of the highly thermally conductive ceramic insulating layer 1.

Heat from the heat generating elements 21 is conducted to the casing 50 through the heat generating element-mounting wiring line 11 and the highly thermally conductive ceramic insulating layer 1.

The heat generating element-mounting module according to a preferred embodiment of the present invention does not necessarily include a casing, and the casing is preferably disposed when necessary at a position to which heat from the highly thermally conductive ceramic insulating layer 1 is conducted.

The casing is preferably made of a metal material having a high thermal conductivity, such as, for example, aluminum or copper.

The heat generating element-mounting module 200 preferably includes, on the glass ceramic insulating layer 2, heat generating element-controlling elements 22 that control driving of the heat generating elements 21, in addition to the heat generating elements 21.

The heat generating element-controlling elements 22 are disposed on a surface 2a of the glass ceramic insulating layer 2 opposite to a surface 2b on which the highly thermally conductive ceramic insulating layer 1 is disposed. The heat generating element-controlling elements 22 are electrically joined to a control circuit including the inner wiring layers 13 disposed inside the glass ceramic insulating layer 2 preferably through a joining material 32 such as solder, for example.

The heat generating elements 21 are preferably electrically joined through wire bonding 24 to wiring lines (surface-layer wiring lines 15) disposed on the glass ceramic insulating layer 2 and are also electrically joined to the heat generating element-controlling elements 22.

The heat generating elements 21 are disposed on the heat generating element-mounting wiring line 11. The heat generating elements 21 are joined to the heat generating element-mounting wiring line 11 preferably using a joining material 31 such as solder or a nano-silver sintered material, for example.

Each of the heat generating elements is preferably made of, for example, at least one element selected from the group consisting of a power element, a control element, a passive component, and a light-emitting element.

When the heat generating element is a power element, a power supply circuit is able to be provided.

The power element is preferably an element defined by a wide band gap semiconductor.

An example of the wide band gap semiconductor is a semiconductor that has a band gap of about 2.2 eV or more and is operable at about 200° C. or higher. Specifically, the semiconductor is preferably silicon carbide or gallium nitride, for example. An example of a semiconductor made of silicon carbide is a SiC-MOSFET. A plurality of power elements may be disposed in a single heat generating element-mounting module.

When the heat generating element is a control element, examples of the control element include FETs and control ICs.

When the heat generating element is a passive component, examples of the passive component include resistors, coils, and capacitors.

When the heat generating element is a light-emitting element, the light-emitting element is at least one element selected from the group consisting of LEDs, organic EL elements, LIDAR elements, RADAR elements, and millimeter-wave elements.

Since these control elements, passive components, and light-emitting elements are elements having a large amount of heat dissipation, a heat generating element-mounting module according to a preferred embodiment of the present invention obtained by mounting these elements on the composite ceramic multilayer substrate according to the present invention is a module having a good heat dissipation property.

The heat generating element-controlling elements 22 are elements that control the heat generating elements 21 and are joined to the surface-layer wiring lines 15 of the control circuit through the joining materials 32 such as, for example, solder.

The control element is preferably an element such as an IC, a chip capacitor, a chip inductor, or a chip resistor, and the IC is, for example, a MOSFET gate driving IC.

A plurality of heat generating element-controlling elements may be disposed in a single heat generating element-mounting module, or different types of heat generating element-controlling elements may be disposed in a single heat generating element-mounting module.

Each element defining the heat generating element-mounting module has been described so far. Hereafter, for example, the positional relationship of each element will be further described.

In the heat generating element-mounting module 200 illustrated in FIG. 4, a first heat generating element-mounting portion 21a and a second heat generating element-mounting portion 21b are preferably provided on the heat generating element-mounting wiring line 11. A partition wall 41 containing the same glass ceramic as the glass ceramic insulating layer 2 is disposed between the first heat generating element-mounting portion 21a and the second heat generating element-mounting portion 21b.

When a plurality of heat generating elements are disposed and partition walls are disposed between the heat generating elements, heating of the heat generating elements due to radiant heat produced by the heat generating elements is able to be reduced or prevented by the partition walls.

The partition walls are able to be defined together with the glass ceramic insulating layer, which does not require an additional process even if the partition walls are provided.

In the heat generating element-mounting module, a glass ceramic insulating layer is preferably interposed between the heat generating element and the heat generating element-controlling element. This will be described with reference to the drawings.

In the heat generating element-mounting module 200 illustrated in FIG. 4, the positional relationship between a heat generating element-controlling element 22a closest to the heat generating elements and a heat generating element 21a closest to the heat generating element-controlling elements will be described. When a line is drawn between a point α close to the heat generating element on an upper surface of the heat generating element-controlling element 22a and a point α' close to the heat generating element-controlling element on an upper surface of the heat generating element 21a, the line crosses a portion of the glass ceramic insulating layer 2. In this case, a glass ceramic insulating layer is interposed between the heat generating element and the heat generating element-controlling element.

Figure 5A:
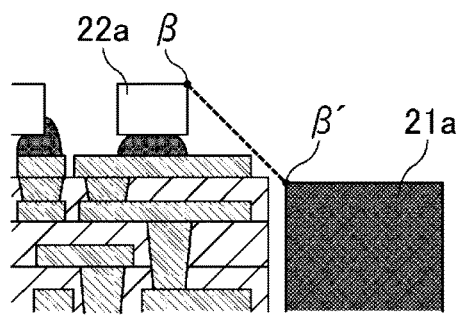
FIGS. 5A and 5B are sectional views each schematically illustrating a portion of the heat generating element-mounting module.
Figure 5B:
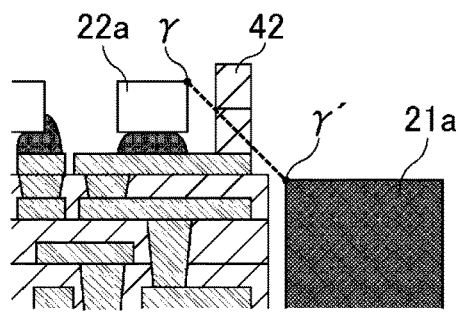

FIGS. 5A and 5B are sectional views each schematically illustrating a portion of the heat generating element-mounting module.

In the portion of the heat generating element-mounting module illustrated in FIG. 5A, the positional relationship between the heat generating element-controlling element 22a closest to the heat generating elements and the heat generating element 21a closest to the heat generating element-controlling elements is illustrated.

The heat generating element-controlling element 22a closest to the heat generating elements is disposed at a position closer to the heat generating element than the position corresponding to the heat generating element-mounting module 200 in FIG. 4, and the height of the heat generating element 21a closest to the heat generating element-controlling elements is increased.

In the positional relationship between the heat generating element-controlling element 22a closest to the heat generating elements and the heat generating element 21a closest to the heat generating element-controlling elements, when a line is drawn between a point β close to the heat generating elements on an upper surface of the heat generating element-controlling element 22a and a point β' close to the heat generating element-controlling element on an upper surface of the heat generating element 21a, the line does not cross the glass ceramic insulating layer. That is, the glass ceramic insulating layer is not interposed between the heat generating element and the heat generating element-controlling element.

FIG. 5B illustrates an example in which a glass ceramic insulating layer 42 is interposed between the heat generating element 21*a* and the heat generating element-controlling element 22*a* in the positional relationship between the heat generating element-controlling element 22*a* closest to the heat generating elements and the heat generating element 21*a* closest to the heat generating element-controlling elements in FIG. 5A.

The glass ceramic insulating layer 42 is positioned so as to define and function as a wall between the heat generating element-controlling element 22*a* and the heat generating element 21*a*. The glass ceramic insulating layer 42 prevents radiant heat of the heat generating element from being conducted to the heat generating element-controlling elements with more certainty.

When a line is drawn between a point γ close to the heat generating element on an upper surface of the heat generating element-controlling element 22*a* and a point γ' close to the heat generating element-controlling element on an upper surface of the heat generating element 21*a*, the line crosses the glass ceramic insulating layer 42.

The glass ceramic insulating layer 42 is preferably a portion of the glass ceramic insulating layer 2 on the highly thermally conductive ceramic insulating layer directly and/or with a wiring layer interposed therebetween. In the production process of the heat generating element-mounting module, the glass ceramic insulating layer 42 is able to be formed together with the glass ceramic insulating layer 2, which does not require an additional process even if this configuration is employed.

Preferably, the heat generating element is disposed in the heat generating element-mounting portion, the heat generating element-mounting portion is filled with a sealing resin, and the heat generating element is sealed with the sealing resin.

Figure 19A:
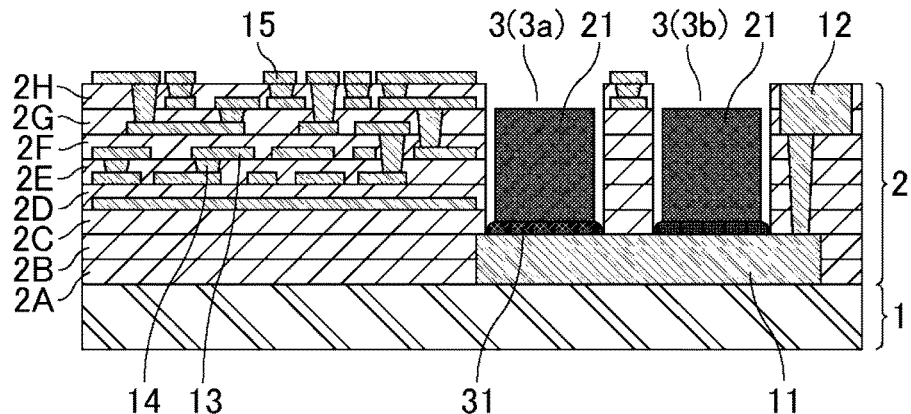
FIGS. 19A to 19C are schematic sectional views partially illustrating the production processes of a heat generating element-mounting module according to a preferred embodiment of the present invention.
Figure 19B:
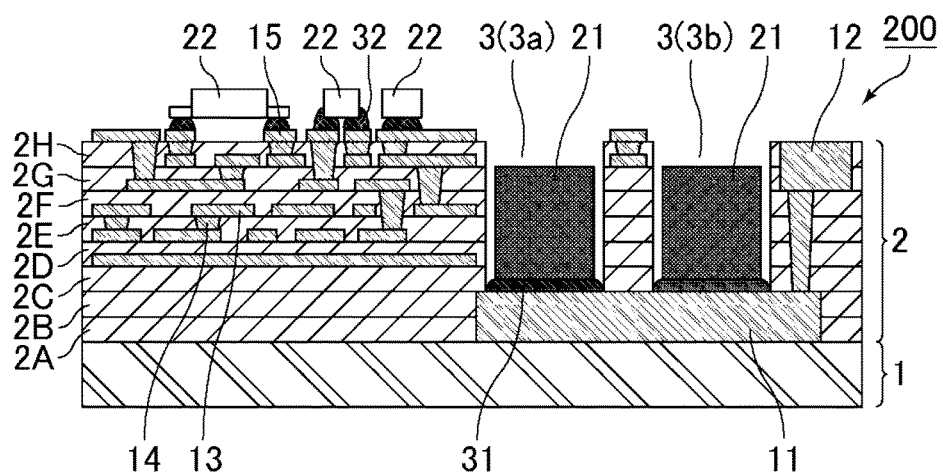
Figure 19C:
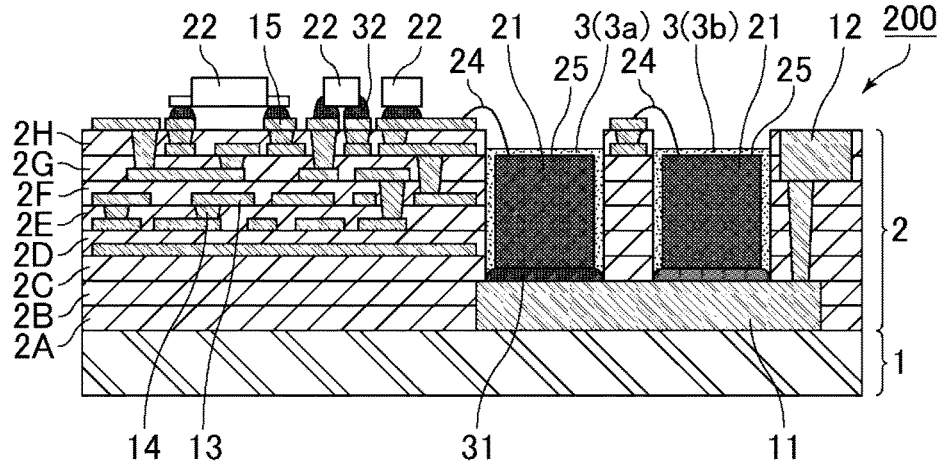

A preferred embodiment in which the heat generating element is sealed with the sealing resin is illustrated in FIG. 19C described below.

In such a preferred embodiment, the glass ceramic insulating layer that surrounds the heat generating element-mounting portion defines and functions as a dam during filling with the sealing resin. Therefore, the heat generating element is able to be sealed with a minimum amount of resin.

The total thickness of the glass ceramic insulating layers is preferably larger than the sum of the thickness of the heat generating element-mounting wiring line and the height of the heat generating element.

FIG. 4 illustrates an example in which the total thickness (indicated by double sided arrow $T_A$) of the glass ceramic insulating layer 2 is larger than the sum of the thickness (indicated by double sided arrow $T_B$) of the heat generating element-mounting wiring line 11 and the height $T_C$ (indicated by double sided arrow $T_C$) of the heat generating element 21. Herein, $T_A>T_B+T_C$ is satisfied.

The total thickness of the glass ceramic insulating layers is defined in a portion in which the glass ceramic insulating layers are directly disposed on the highly thermally conductive ceramic insulating layer.

When the total thickness of the glass ceramic insulating layers is larger than the sum of the thickness of the heat generating element-mounting wiring line and the height of the heat generating element in the thickness direction of the highly thermally conductive ceramic insulating layer, the position of the heat generating element-controlling element is higher than that of the heat generating element. FIG. 4 illustrates the heat generating element-controlling elements 22 located at a position higher than that of the heat generating elements 21.

When the heat generating element-controlling element and the heat generating element are disposed in this manner, radiant heat from the heat generating element is not easily conducted to the heat generating element-controlling element.

Next, a composite ceramic multilayer substrate and a heat generating element-mounting module according to other preferred embodiments of the present invention will be described.

In the composite ceramic multilayer substrate according to preferred embodiments of the present invention, the glass ceramic insulating layer may be provided on a main surface of the highly thermally conductive ceramic insulating layer with a wiring layer interposed therebetween.

Figure 6:
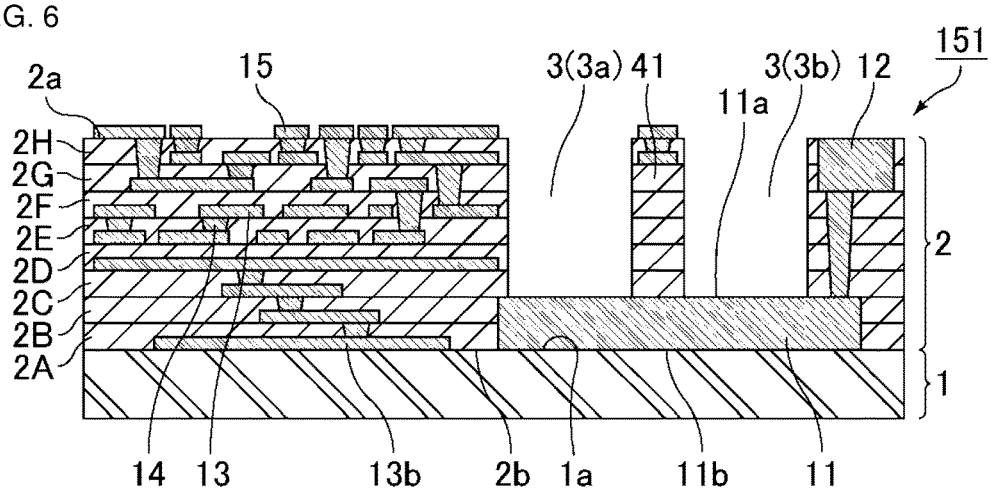
FIG. 6 is a sectional view schematically illustrating another example of a composite ceramic multilayer substrate according to a preferred embodiment of the present invention.

FIG. 6 is a sectional view schematically illustrating another example of a composite ceramic multilayer substrate according to a preferred embodiment of the present invention.

A composite ceramic multilayer substrate 151 illustrated in FIG. 6 includes an inner wiring layer 13*b* disposed on a surface 1*a* of the highly thermally conductive ceramic insulating layer 1. A glass ceramic insulating layer 2A is disposed on the surface 1*a* with the inner wiring layer 13*b* interposed therebetween.

In this case, a glass ceramic component contained in the glass ceramic insulating layer disposed on the surface 1*a* with the inner wiring layer interposed therebetween does not diffuse into the highly thermally conductive ceramic insulating layer.

The position of the inner wiring layer is not higher than that of the heat generating element-mounting wiring line.

In terms of these points, the composite ceramic multilayer substrate 151 illustrated in FIG. 6 is different from the composite ceramic multilayer substrate 100 illustrated in FIG. 1.

Even such a composite ceramic multilayer substrate is able to be used as a circuit board including, in an integrated manner, a heat generating element-mounting wiring line to mount heat generating elements and a wiring layer that is able to be used as a control circuit.

In a composite ceramic multilayer substrate according to a present preferred embodiment of the present invention, the glass ceramic insulating layer may preferably be provided on both main surfaces of the highly thermally conductive ceramic insulating layer.

Figure 7:
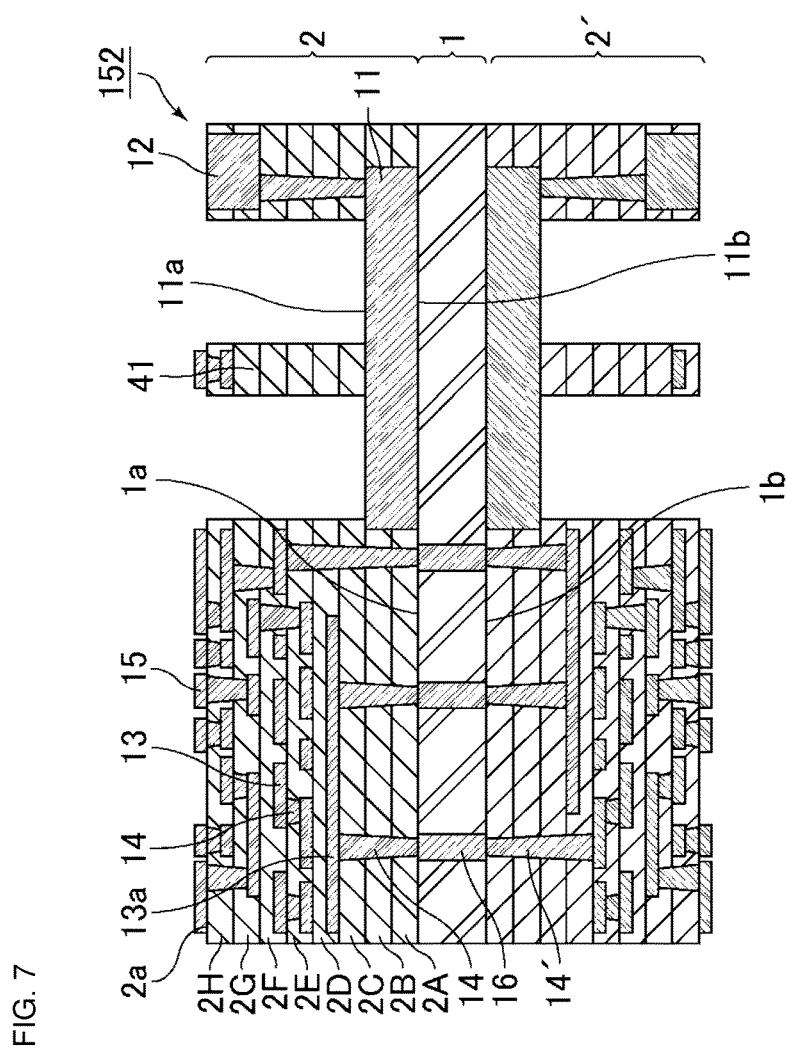
FIG. 7 is a sectional view schematically illustrating another example of a composite ceramic multilayer substrate according to a preferred embodiment of the present invention.

FIG. 7 is a sectional view schematically illustrating another example of a composite ceramic multilayer substrate according to a preferred embodiment of the present invention.

In a composite ceramic multilayer substrate 152 illustrated in FIG. 7, a glass ceramic insulating layer 2 is provided on a main surface 1*a* of the highly thermally conductive ceramic insulating layer 1, and a glass ceramic insulating layer 2' is provided on a main surface 1*b* of the highly thermally conductive ceramic insulating layer 1.

The glass ceramic insulating layer 2' may have the same or substantially the same configuration as the glass ceramic insulating layer 2.

By disposing a glass ceramic insulating layer on both main surfaces of the highly thermally conductive ceramic insulating layer, the composite ceramic multilayer substrate is able to be used as a double-sided board.

FIG. 7 illustrates a preferred embodiment in which the glass ceramic insulating layer is directly provided on both main surfaces of the highly thermally conductive ceramic insulating layer. The glass ceramic insulating layer may be provided on both main surfaces of the highly thermally conductive ceramic insulating layer with a wiring layer interposed therebetween.

When the glass ceramic insulating layer is provided on both main surfaces of the highly thermally conductive ceramic insulating layer, via electrodes that electrically connect one main surface of the highly thermally conductive ceramic insulating layer to the other main surface are preferably provided.

FIG. 7 illustrates via electrodes 16 disposed in the highly thermally conductive ceramic insulating layer 1. Each of the via electrodes 16 electrically connects a via conductor 14 that is a portion of the wiring layer disposed in the glass ceramic insulating layer 2 to a via conductor 14' that is a portion of the wiring layer disposed in the glass ceramic insulating layer 2'.

Figure 8:
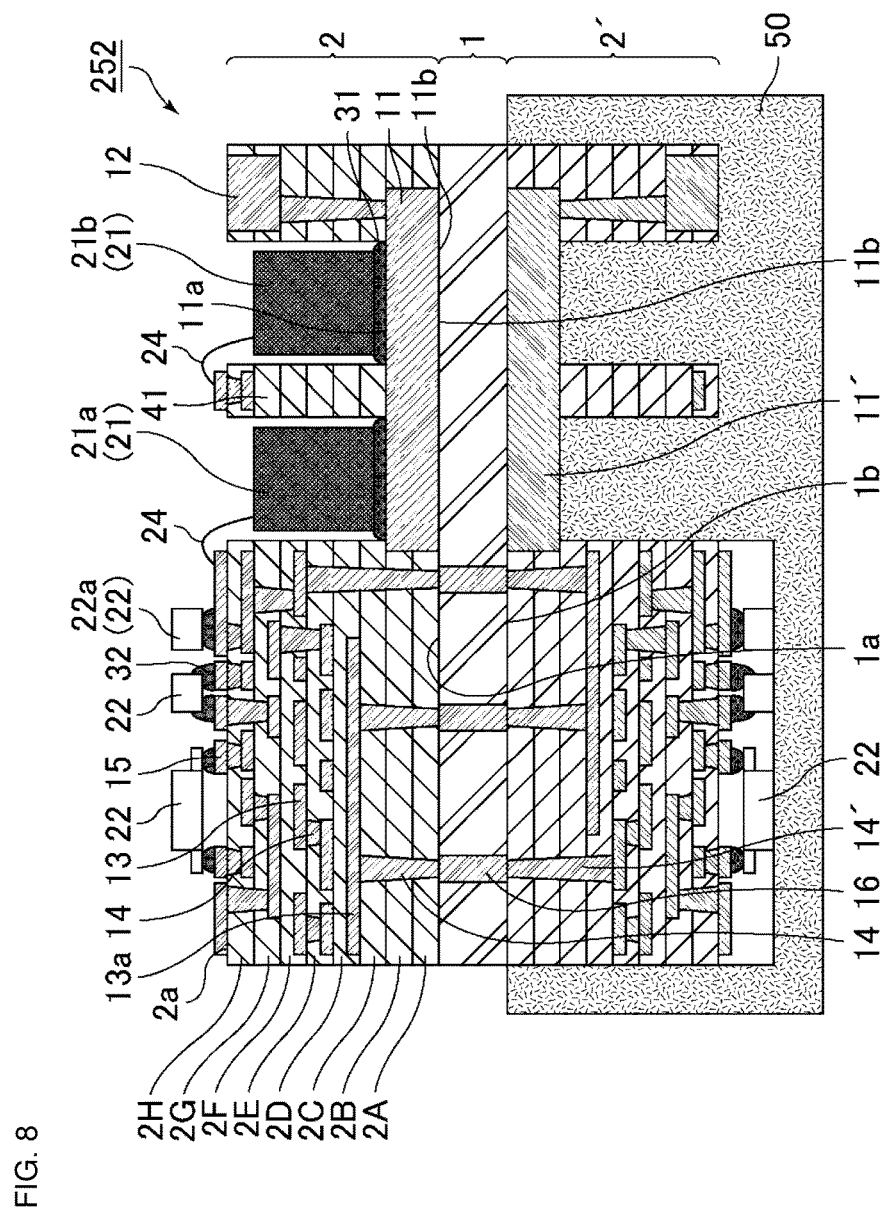
FIG. 8 is a sectional view schematically illustrating an example of a heat generating element-mounting module that uses the composite ceramic multilayer substrate illustrated in FIG. 7.

FIG. 8 is a sectional view schematically illustrating an example of a heat generating element-mounting module that includes the composite ceramic multilayer substrate illustrated in FIG. 7.

In a heat generating element-mounting module 252 illustrated in FIG. 8, heat generating elements 21 are mounted in heat generating element-mounting portions of the composite ceramic multilayer substrate 152 illustrated in FIG. 7.

Furthermore, heat generating element-controlling elements 22 that control driving of the heat generating elements are mounted on the glass ceramic insulating layer 2 and also heat generating element-controlling elements 22 are mounted on the glass ceramic insulating layer 2'.

The phrase "on the glass ceramic insulating layer 2'" means "on a front surface (a surface facing downward in FIG. 8) of the glass ceramic insulating layer 2'" regardless of the upper or lower side in the drawing.

A casing 50 is disposed on the main surface 1b side of the highly thermally conductive ceramic insulating layer 1. The casing 50 covers the glass ceramic insulating layer 2'. The casing is also in contact with a heat generating element-mounting wiring line 11' that is in contact with the main surface 1b of the highly thermally conductive ceramic insulating layer 1.

Therefore, heat from the heat generating elements 21 is conducted to the casing 50 through the heat generating element-mounting wiring line 11, the highly thermally conductive ceramic insulating layer 1, and the heat generating element-mounting wiring line 11'.

In a composite ceramic multilayer substrate according to a preferred embodiment of the present invention, the main surfaces of the highly thermally conductive ceramic insulating layer may be exposed at the peripheries of the composite ceramic multilayer substrate.

Figure 9:
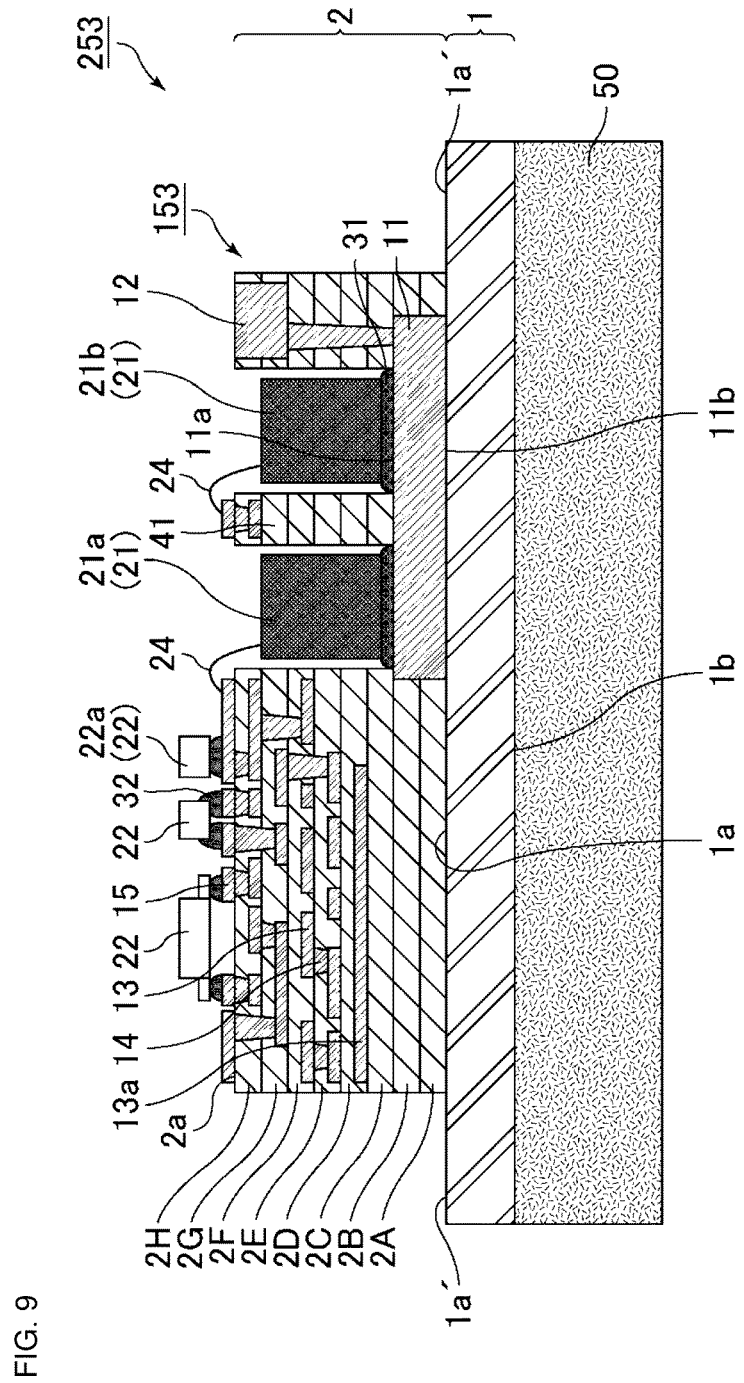
FIG. 9 is a sectional view schematically illustrating an example of a heat generating element-mounting module that uses another example of a composite ceramic multilayer substrate according to a preferred embodiment of the present invention.

FIG. 9 is a sectional view schematically illustrating an example of a heat generating element-mounting module that uses another example of a composite ceramic multilayer substrate according to a preferred embodiment of the present invention.

FIG. 9 illustrates a heat generating element-mounting module 253 obtained by mounting heat generating elements 21 on a composite ceramic multilayer substrate 153.

In the composite ceramic multilayer substrate 153 illustrated in FIG. 9, a portion of the main surface 1a of the highly thermally conductive ceramic insulating layer 1 is exposed at the peripheries of the composite ceramic multilayer substrate 153. The portions at which a portion of the main surface 1a of the highly thermally conductive ceramic insulating layer 1 is exposed are shown at both ends of the highly thermally conductive ceramic insulating layer 1 using reference symbol 1a'.

A casing 50 is disposed on the main surface 1b side of the highly thermally conductive ceramic insulating layer 1.

When the main surface of the highly thermally conductive ceramic insulating layer is exposed at the peripheries of the composite ceramic multilayer substrate, heat is able to be dissipated from the exposed main surface of the highly thermally conductive ceramic insulating layer.

Figure 10:
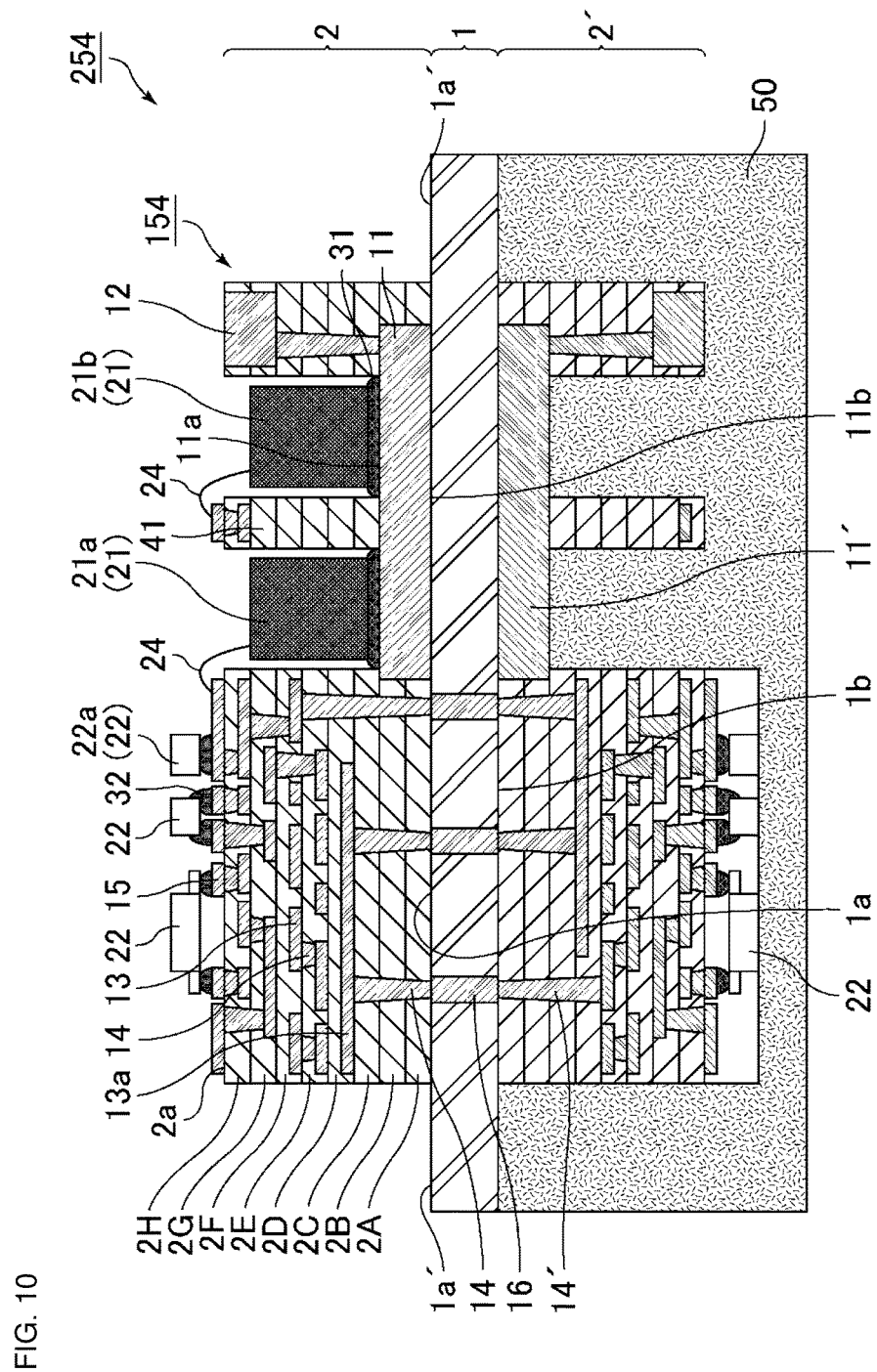
FIG. 10 is a sectional view schematically illustrating an example of a heat generating element-mounting module that uses the composite ceramic multilayer substrate in FIG. 9 as a double-sided board.

FIG. 10 is a sectional view schematically illustrating an example of a heat generating element-mounting module that includes a composite ceramic multilayer substrate in FIG. 9 as a double-sided board.

FIG. 10 illustrates a heat generating element-mounting module 254 obtained by mounting heat generating elements 21 on a composite ceramic multilayer substrate 154.

In the composite ceramic multilayer substrate 154 illustrated in FIG. 10, a portion of the main surface 1a of the highly thermally conductive ceramic insulating layer 1 is exposed at the peripheries of the composite ceramic multilayer substrate 154 as in the case of the composite ceramic multilayer substrate 153 illustrated in FIG. 9.

The composite ceramic multilayer substrate 154 is preferably a double-sided board in which a glass ceramic insulating layer is disposed on both main surfaces of the highly thermally conductive ceramic insulating layer as in the case of the composite ceramic multilayer substrate 152 illustrated in FIG. 7.

FIGS. 9 and 10 illustrate a preferred embodiment of the present invention in which the glass ceramic insulating layer is directly provided on the main surface of the highly thermally conductive ceramic insulating layer. The glass ceramic insulating layer may be provided on the main surface of the highly thermally conductive ceramic insulating layer with a wiring layer interposed therebetween.

In a composite ceramic multilayer substrate according to a preferred embodiment of the present invention, through holes used in screw fixing may be provided in portions of a main surface of the highly thermally conductive ceramic insulating layer, the portions being exposed at the peripheries of the composite ceramic multilayer substrate.

Figure 11:
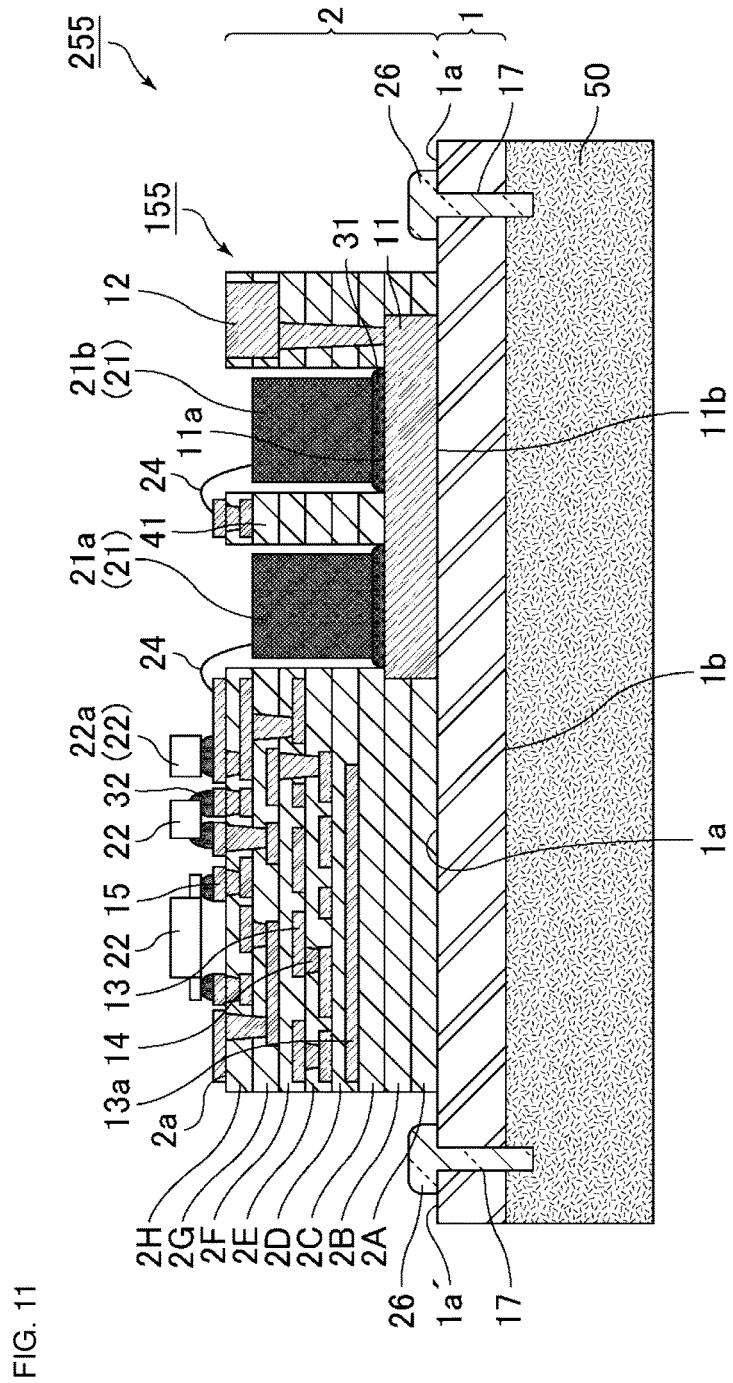
FIG. 11 is a sectional view schematically illustrating an example of a heat generating element-mounting module that uses another example of a composite ceramic multilayer substrate according to a preferred embodiment of the present invention.

FIG. 11 is a sectional view schematically illustrating an example of a heat generating element-mounting module that uses another example of a composite ceramic multilayer substrate according to a preferred embodiment of the present invention.

FIG. 11 illustrates a heat generating element-mounting module 255 obtained by mounting heat generating elements 21 on a composite ceramic multilayer substrate 155.

In the composite ceramic multilayer substrate 155 illustrated in FIG. 11, a portion of the main surface 1a of the highly thermally conductive ceramic insulating layer 1 is exposed at the peripheries of the composite ceramic multilayer substrate 155. Through holes 17 used in screw fixing are preferably provided in portions 1a' at which a portion of the main surface 1a of the highly thermally conductive ceramic insulating layer 1 is exposed. Screws 26 are inserted into the through holes 17 to fix the casing 50 with the screws.

When through holes used in screw fixing are provided in portions of a main surface of the highly thermally conductive ceramic insulating layer, the portions being exposed at the peripheries of the composite ceramic multilayer substrate, the highly thermally conductive ceramic insulating layer is able to be fixed to the casing with screws and thus heat is able to be directly dissipated from the highly thermally conductive ceramic insulating layer to the casing.

Figure 12:
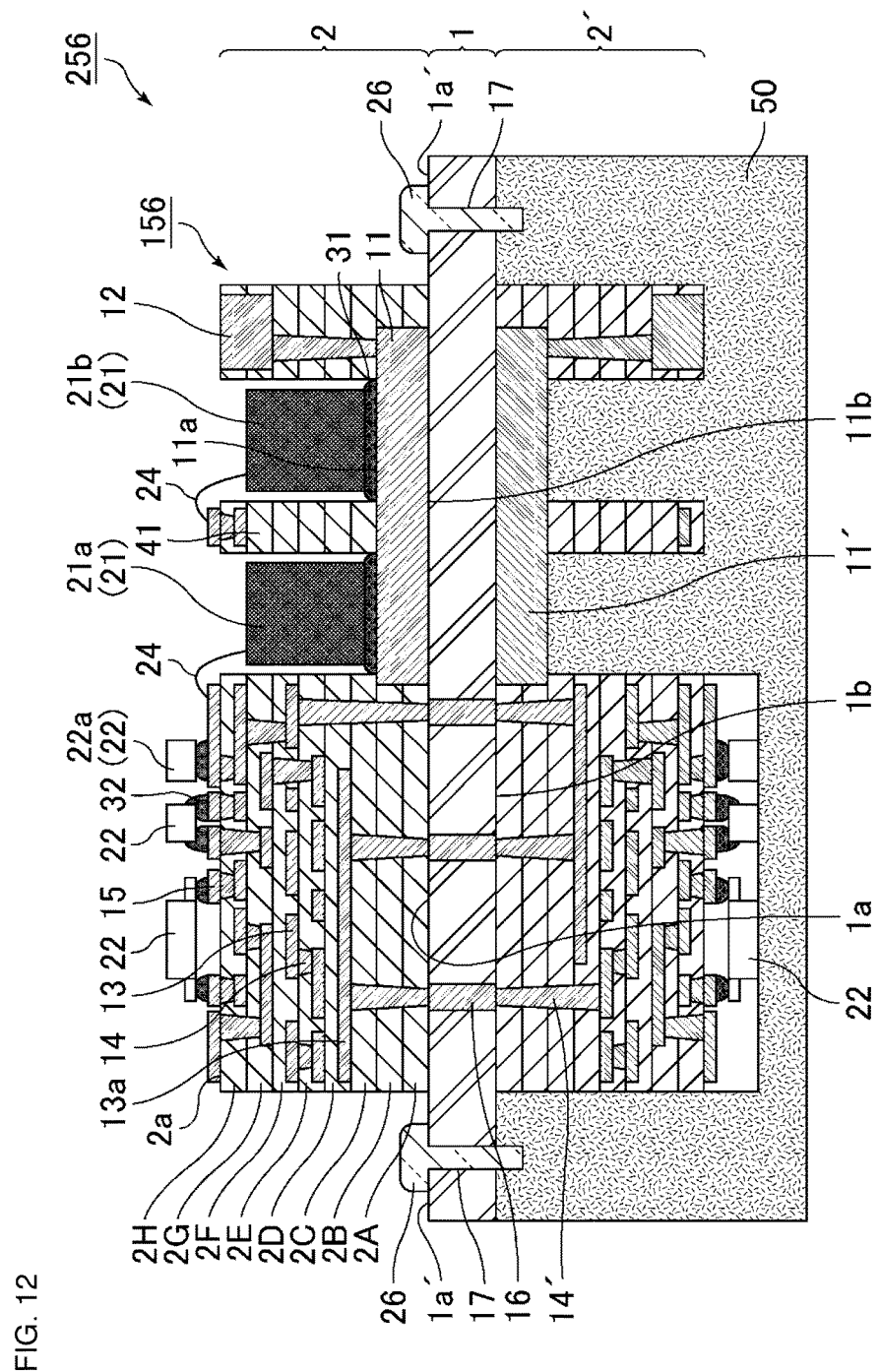
FIG. 12 is a sectional view schematically illustrating an example of a heat generating element-mounting module that uses the composite ceramic multilayer substrate in FIG. 11 as a double-sided board.

FIG. 12 is a sectional view schematically illustrating an example of a heat generating element-mounting module that includes the composite ceramic multilayer substrate in FIG. 11 as a double-sided board.

FIG. 12 illustrates a heat generating element-mounting module 256 obtained by mounting heat generating elements 21 on a composite ceramic multilayer substrate 156.

In the composite ceramic multilayer substrate 156 illustrated in FIG. 12, a portion of the main surface 1a of the highly thermally conductive ceramic insulating layer 1 is exposed at the peripheries of the composite ceramic multilayer substrate 156 as in the case of the composite ceramic multilayer substrate 155 illustrated in FIG. 11. Through holes 17 used in screw fixing are preferably provided in portions 1a' at which a portion of the main surface 1a of the highly thermally conductive ceramic insulating layer 1 is exposed. Screws 26 are inserted into the through holes 17 to fix the casing 50 with the screws.

The composite ceramic multilayer substrate 156 illustrated in FIG. 12 is a double-sided board in which a glass ceramic insulating layer is disposed on both main surfaces of the highly thermally conductive ceramic insulating layer as in the case of the composite ceramic multilayer substrate 152 illustrated in FIG. 7.

FIGS. 11 and 12 illustrate a preferred embodiment of the present invention in which the glass ceramic insulating layer is directly provided on the main surface of the highly thermally conductive ceramic insulating layer. The glass ceramic insulating layer may be provided on the main surface of the highly thermally conductive ceramic insulating layer with a wiring layer interposed therebetween.

In the composite ceramic multilayer substrate according to a preferred embodiment of the present invention, an electrode to which a conductor used in power supply input/output is welded may be provided in a portion of a main surface of the highly thermally conductive ceramic insulating layer, the portion being exposed at the peripheries of the composite ceramic multilayer substrate.

Figure 13:
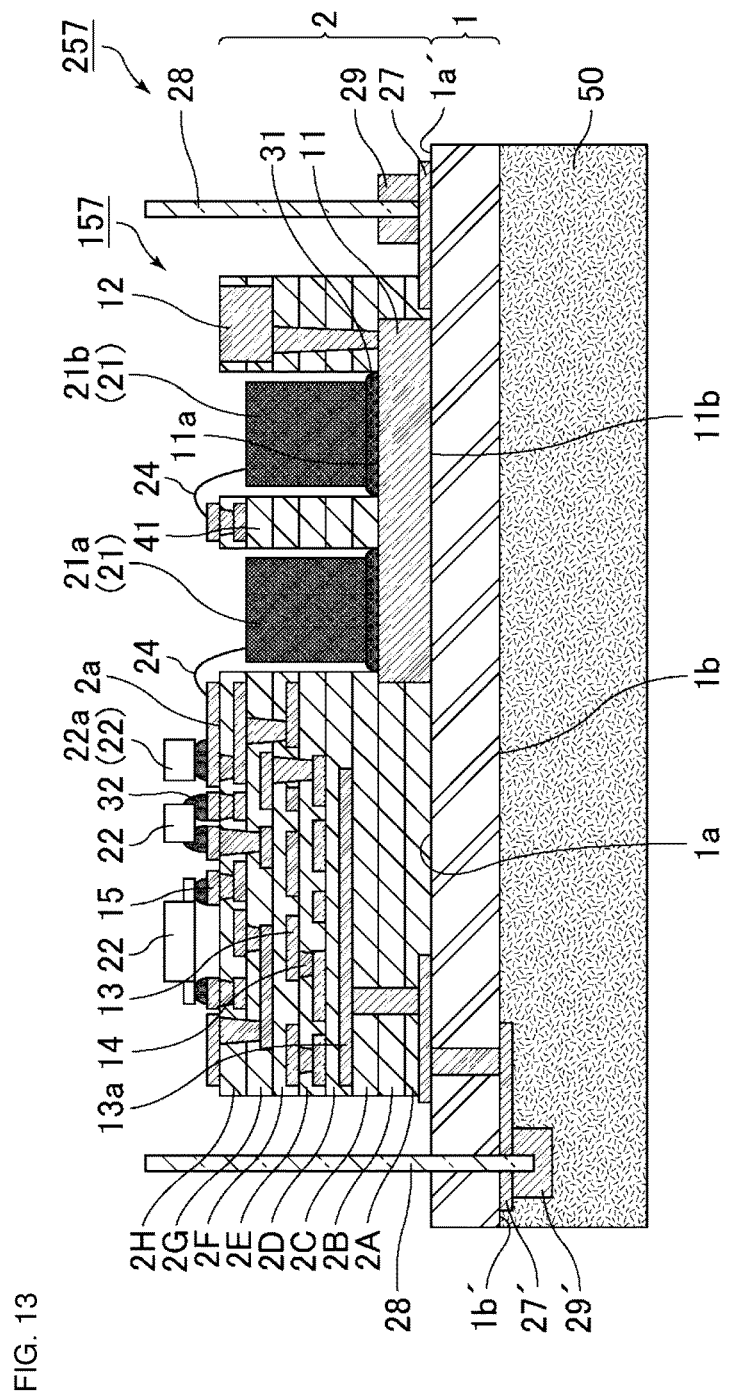
FIG. 13 is a sectional view schematically illustrating an example of a heat generating element-mounting module that uses another example of a composite ceramic multilayer substrate according to a preferred embodiment of present invention.

FIG. 13 is a sectional view schematically illustrating an example of a heat generating element-mounting module that includes another example of a composite ceramic multilayer substrate according to a preferred embodiment of the present invention.

FIG. 13 illustrates a heat generating element-mounting module 257 obtained by mounting heat generating elements 21 on a composite ceramic multilayer substrate 157.

In the composite ceramic multilayer substrate 157 illustrated in FIG. 13, a portion of the main surface 1a of the highly thermally conductive ceramic insulating layer 1 is exposed at the peripheries of the composite ceramic multilayer substrate 157 as illustrated on the right side in FIG. 13. An electrode 27 is preferably provided in a portion 1a' at which a portion of the main surface 1a of the highly thermally conductive ceramic insulating layer 1 is exposed.

The electrode 27 is an electrode to which a metal pin 28 defining and functioning as a conductor used in power supply input/output is welded using a joining material 29, such as solder, for example.

As illustrated on the left side in FIG. 13, an electrode 27' may be provided in a portion 1b' at which a portion of the main surface 1b of the highly thermally conductive ceramic insulating layer 1 is exposed. A metal pin 28 used in power supply input/output may be welded to the electrode 27' using a joining material 29', such as solder, for example.

FIG. 13 illustrates a preferred embodiment of the present invention in which a metal pin used in power supply input/output is welded to an electrode. Alternatively, a metal plate used in power supply input/output may be welded to the electrode.

When an electrode is provided in a portion of a main surface of the highly thermally conductive ceramic insulating layer, the portion being exposed at the peripheries of the composite ceramic multilayer substrate, a conductor used in power supply input/output is able to be welded.

Figure 14:
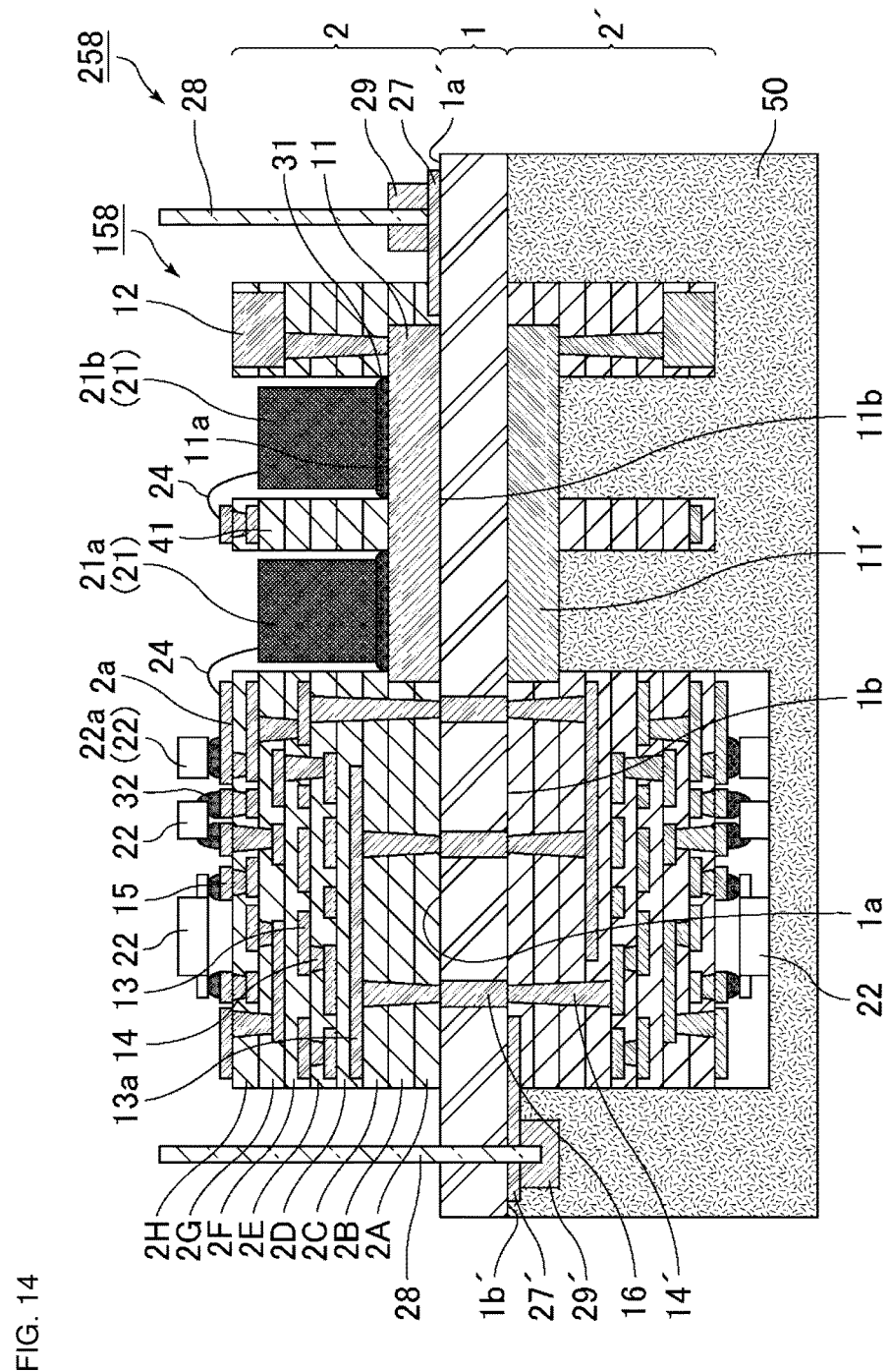
FIG. 14 is a sectional view schematically illustrating an example of a heat generating element-mounting module that uses the composite ceramic multilayer substrate in FIG. 13 as a double-sided board.

FIG. 14 is a sectional view schematically illustrating an example of a heat generating element-mounting module that includes the composite ceramic multilayer substrate in FIG. 13 as a double-sided board.

FIG. 14 illustrates a heat generating element-mounting module 258 obtained by mounting heat generating elements 21 on a composite ceramic multilayer substrate 158.

In the composite ceramic multilayer substrate 158 illustrated in FIG. 14, a portion of the main surface 1a of the highly thermally conductive ceramic insulating layer 1 is exposed at the peripheries of the composite ceramic multilayer substrate 158 as in the case of the composite ceramic multilayer substrate 157 illustrated in FIG. 13. An electrode 27 is preferably provided in a portion 1a' at which a portion of a main surface 1a of the highly thermally conductive ceramic insulating layer 1 is exposed, and a metal pin 28 is welded to the electrode 27 using a joining material 29 such as solder, for example.

As illustrated on the left side in FIG. 14, an electrode 27' may be provided in a portion 1b' at which a portion of the main surface 1b of the highly thermally conductive ceramic insulating layer 1 is exposed. A metal pin 28 used in power supply input/output is preferably welded to the electrode 27' using a joining material 29' such as solder, for example.

The composite ceramic multilayer substrate 158 illustrated in FIG. 14 is preferably a double-sided board in which a glass ceramic insulating layer is disposed on both main surfaces of the highly thermally conductive ceramic insulating layer as in the case of the composite ceramic multilayer substrate 152 illustrated in FIG. 7.

FIGS. 13 and 14 illustrate a preferred embodiment of the present invention in which the glass ceramic insulating layer is directly provided on the main surface of the highly thermally conductive ceramic insulating layer. The glass ceramic insulating layer may be provided on the main surface of the highly thermally conductive ceramic insulating layer with a wiring layer interposed therebetween.

In a composite ceramic multilayer substrate according to a preferred embodiment of the present invention, the highly thermally conductive ceramic insulating layer may be partially disposed in a region including at least a portion immediately below the heat generating element-mounting portion in a main surface direction of the composite ceramic multilayer substrate.

Figure 15:
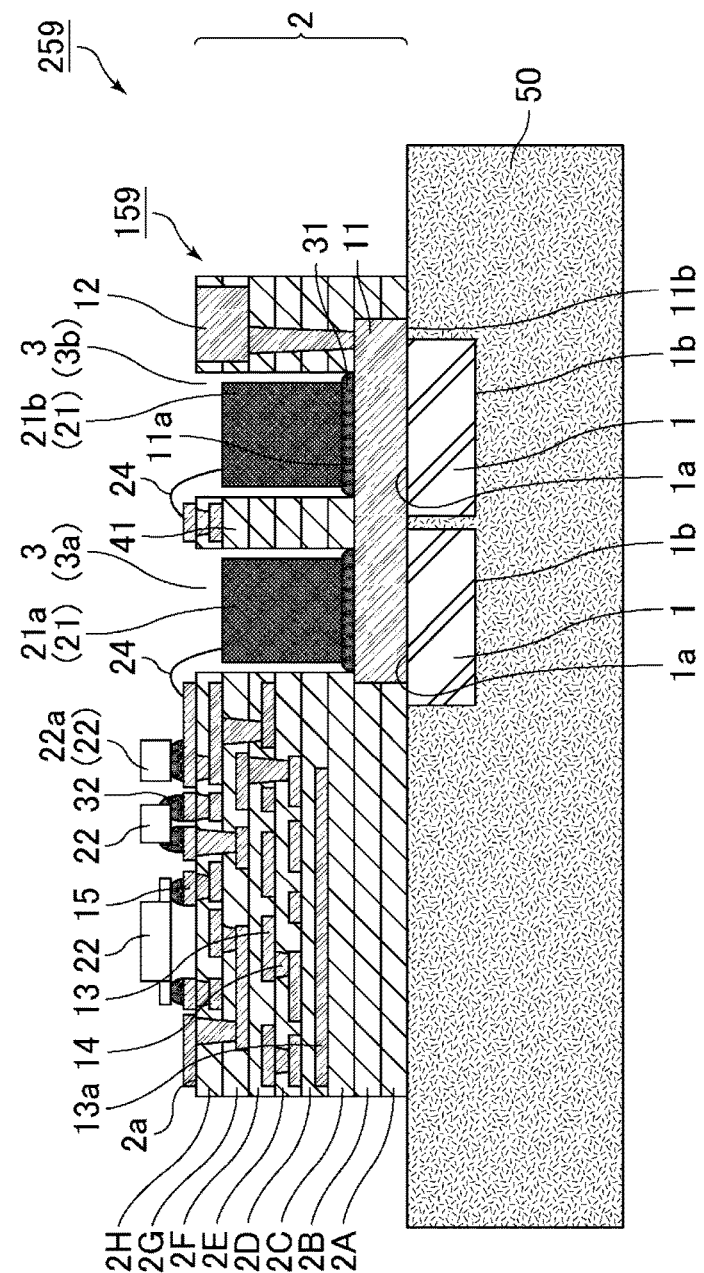
FIG. 15 is a sectional view schematically illustrating an example of a heat generating element-mounting module that uses another example of a composite ceramic multilayer substrate according to a preferred embodiment of the present invention.

FIG. 15 is a sectional view schematically illustrating an example of a heat generating element-mounting module that includes another example of a composite ceramic multilayer substrate according to a preferred embodiment of the present invention.

FIG. 15 illustrates a heat generating element-mounting module 259 obtained by mounting heat generating elements 21 on a composite ceramic multilayer substrate 159.

In the composite ceramic multilayer substrate 159 illustrated in FIG. 15, highly thermally conductive ceramic insulating layers 1 are disposed only in regions immediately below the heat generating element-mounting portions 3.

There are preferably two highly thermally conductive ceramic insulating layers 1 in a divided manner because of the two separated heat generating element-mounting portions 3, but the two highly thermally conductive ceramic insulating layers 1 may alternatively be provided as a single layer if so desired.

When the highly thermally conductive ceramic insulating layer is disposed in a region including a portion immediately below the heat generating element-mounting portion, the heat dissipation property is able to be locally improved.

Figure 16:
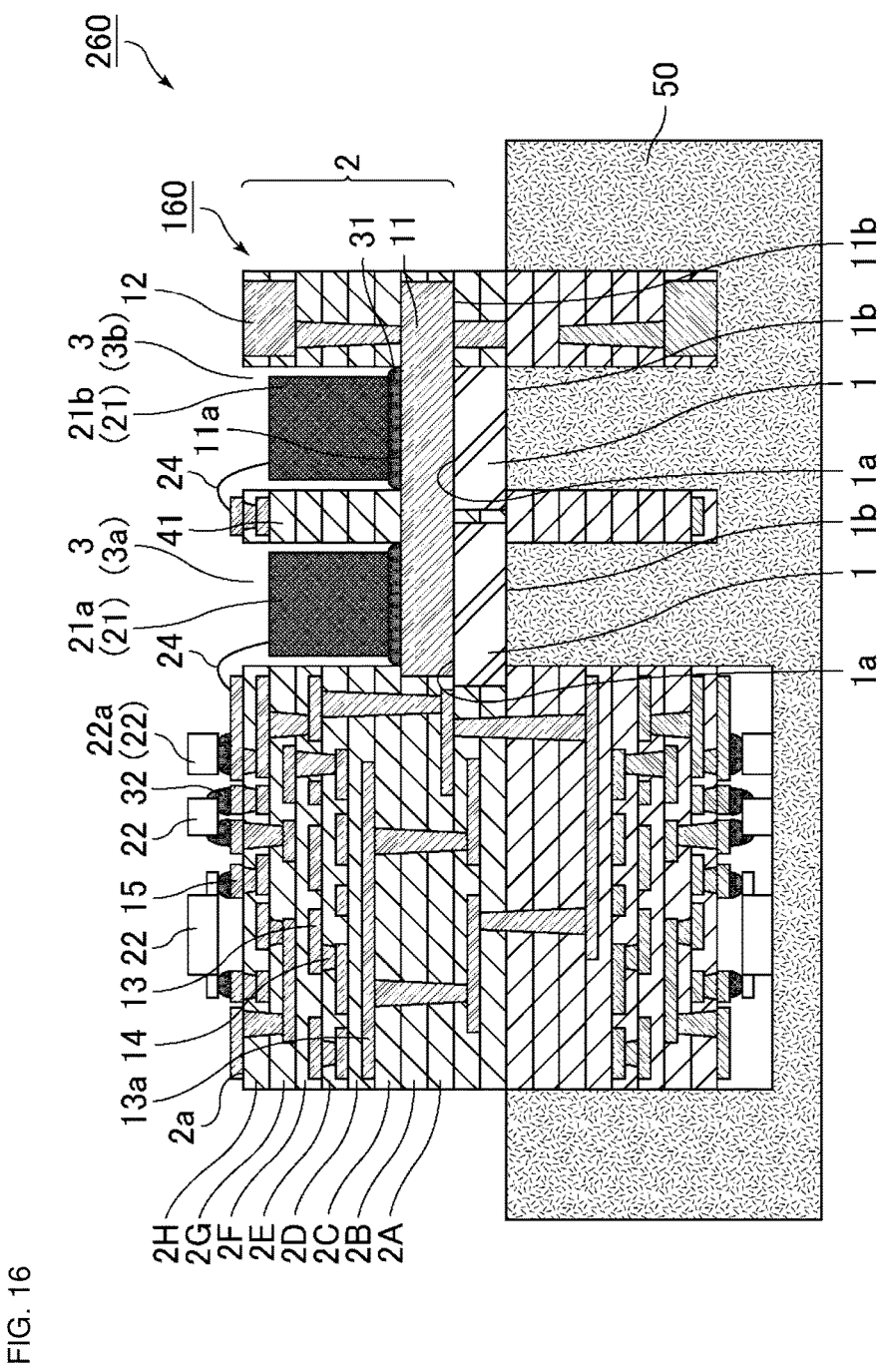
FIG. 16 is a sectional view schematically illustrating an example of a heat generating element-mounting module that uses the composite ceramic multilayer substrate in FIG. 15 as a double-sided board.

FIG. 16 is a sectional view schematically illustrating an example of a heat generating element-mounting module that includes the composite ceramic multilayer substrate in FIG. 15 as a double-sided board.

FIG. 16 illustrates a heat generating element-mounting module 260 obtained by mounting heat generating elements 21 on a composite ceramic multilayer substrate 160.

In the composite ceramic multilayer substrate 160 illustrated in FIG. 16, highly thermally conductive ceramic insulating layers 1 are preferably disposed only in regions immediately below heat generating element-mounting portions 3 as in the case of the composite ceramic multilayer substrate 159 illustrated in FIG. 15.

The highly thermally conductive ceramic insulating layers 1 are in contact with the casing 50 on the main surface 1b side of the highly thermally conductive ceramic insulating layers 1.

The composite ceramic multilayer substrate 160 illustrated in FIG. 16 is a double-sided board in which a glass ceramic insulating layer is disposed on both main surfaces of the highly thermally conductive ceramic insulating layer as in the case of the composite ceramic multilayer substrate 152 illustrated in FIG. 7.

FIGS. 15 and 16 illustrate a preferred embodiment of the present invention in which the glass ceramic insulating layer is directly provided on the main surface of the highly thermally conductive ceramic insulating layer. The glass ceramic insulating layer may be provided on the main surface of the highly thermally conductive ceramic insulating layer with a wiring layer interposed therebetween.

Next, examples of a composite ceramic multilayer substrate and a heat generating element-mounting module according to other preferred embodiments of the present invention will be described.

A composite ceramic multilayer substrate according to another preferred embodiment of the present invention preferably includes a heat generating element-mounting wiring line, a glass ceramic insulating layer, and a highly thermally conductive ceramic insulating layer made of a ceramic material having a higher thermal conductivity than a glass ceramic contained in the glass ceramic insulating layer. The heat generating element-mounting wiring line is disposed on the highly thermally conductive ceramic insulating layer, and the glass ceramic insulating layer is directly disposed on the highly thermally conductive ceramic insulating layer.

The composite ceramic substrate according to the present preferred embodiment is preferably the same or substantially the same as the above-described composite ceramic multilayer substrates according to preferred embodiments of the present invention in terms of the presence of the heat generating element-mounting wiring line, the glass ceramic insulating layer, and the highly thermally conductive ceramic insulating layer.

In the composite ceramic substrate according to the present preferred embodiment, the glass ceramic insulating layer is preferably directly disposed on the highly thermally conductive ceramic insulating layer.

When viewed in a direction perpendicular or substantially perpendicular to the main surface of the composite ceramic multilayer substrate, a heat generating element-mounting portion which is surrounded by the glass ceramic insulating layer and in which the glass ceramic insulating layer is not present is not necessarily provided.

In preferred embodiments of the present invention, the heat generating element-mounting wiring line, the glass ceramic insulating layer, and the highly thermally conductive ceramic insulating layer are the same or substantially the same as those in the above-described composite ceramic multilayer substrates according to preferred embodiments of the present invention.

In a heat generating element-mounting module according to another preferred embodiment of the present invention, a heat generating element is preferably mounted on the heat generating element-mounting wiring line of the composite ceramic multilayer substrate according to another preferred embodiment of the present invention.

A preferred embodiment in which a heat generating element and other elements are mounted on the composite ceramic multilayer substrate in the heat generating element-mounting module is the same or substantially the same as that of the above-described heat generating element-mounting modules according to preferred embodiments of the present invention.

Herein, the same or substantially the same heat generating element as that mounted on the above-described heat generating element-mounting modules according to preferred embodiments of the present invention are able to be used.

Next, non-limiting examples of methods of producing the composite ceramic multilayer substrate and the heat generating element-mounting module according to preferred embodiments of the present invention will be described.

Hereafter, representative examples of a method of producing the composite ceramic multilayer substrate 100 in FIG. 1 and a method of producing the heat generating element-mounting module 200 in FIG. 4 will be described.

The above-described composite ceramic multilayer substrate and heat generating element-mounting module according to preferred embodiments of the present invention are able to be produced by the same or substantially the same methods.

FIGS. 17A to 17E are schematic sectional views partially illustrating the production processes of the composite ceramic multilayer substrate according to a preferred embodiment of the present invention.

Figure 18A:
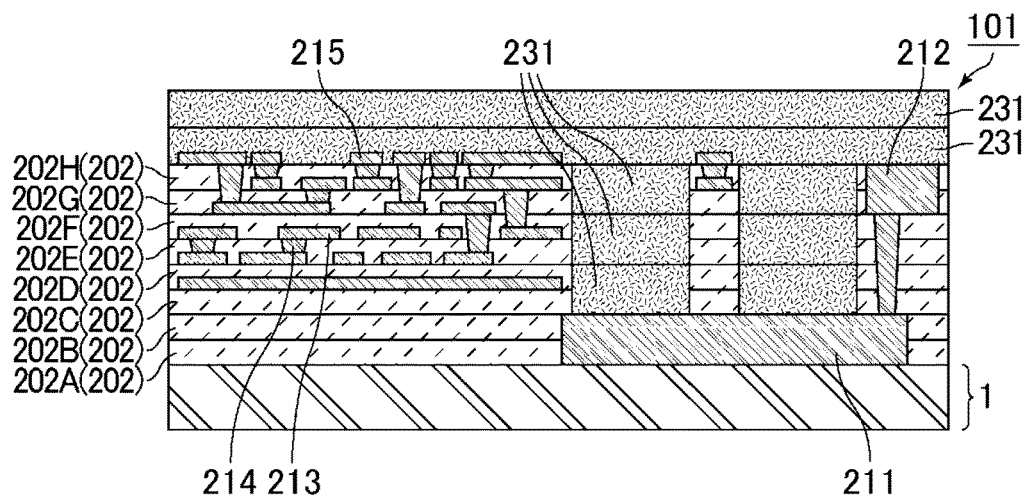
FIGS. 18A to 18C are schematic sectional views partially illustrating the production processes of a composite ceramic multilayer substrate according to a preferred embodiment of the present invention.
Figure 18B:
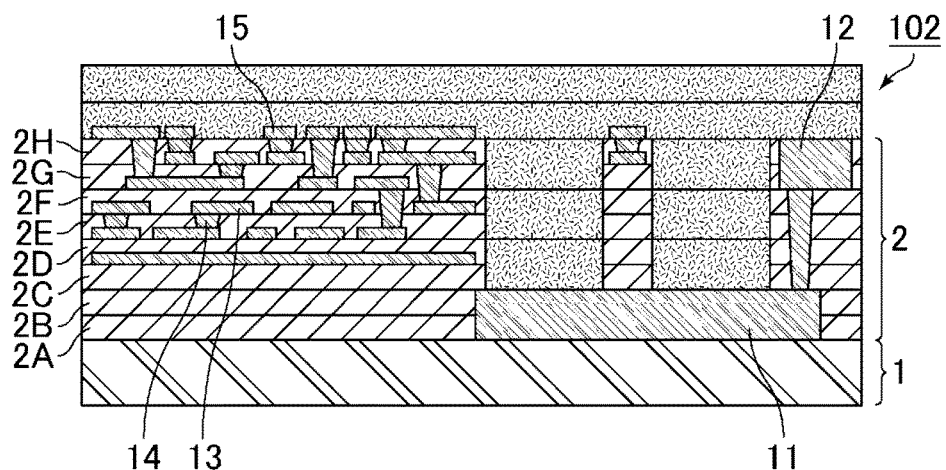
Figure 18C:
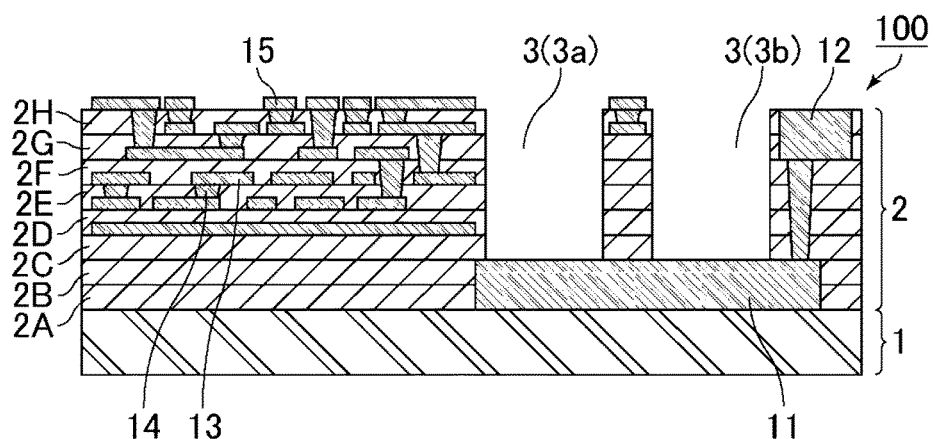

FIGS. 18A to 18C are schematic sectional views partially illustrating the production processes of the composite ceramic multilayer substrate according to a preferred embodiment of the present invention.

FIGS. 19A to 19C are schematic sectional views partially illustrating the production processes of the heat generating element-mounting module according to a preferred embodiment of the present invention.

Figure 17A:
FIGS. 17A to 17E are schematic sectional views partially illustrating the production processes of a composite ceramic multilayer substrate according to a preferred embodiment of the present invention.

First, as illustrated in FIG. 17A, a highly thermally conductive ceramic sintered body to define and function as a highly thermally conductive ceramic insulating layer 1 is provided. The highly thermally conductive ceramic sintered body is preferably, for example, a highly thermally conductive ceramic sintered body that is made of about 96% alumina and has a thickness of about 0.5 mm, a thermal conductivity of about 21 $W \cdot m^{-1} \cdot K^{-1}$, an average thermal expansion coefficient at about 30° C. to about 300° C. of about 7.8 $ppm \cdot K^{-1}$, a flexural strength (three-point bending strength) of about 350 MPa, and a fracture toughness of about 5 $MPa \cdot m^{1/2}$.

Figure 17B:
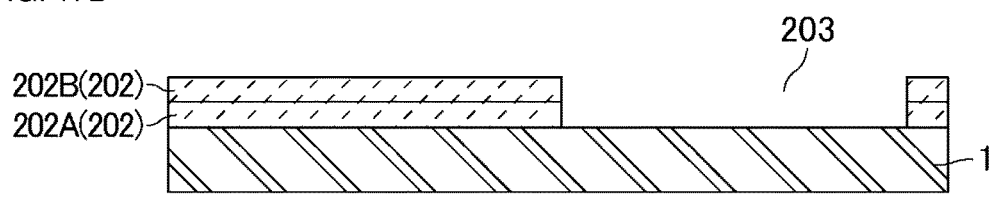

Subsequently, as illustrated in FIG. 17B, glass ceramic green sheets 202 to defined and function as glass ceramic insulating layers are preferably stacked on the highly thermally conductive ceramic insulating layer 1. After the stacking, pressure bonding is preferably performed by hot pressing, for example.

The glass ceramic green sheets may be directly stacked on the highly thermally conductive ceramic insulating layer or may be stacked on the highly thermally conductive ceramic insulating layer with a wiring layer interposed therebetween.

In FIG. 17B, two glass ceramic green sheets 202 (glass ceramic green sheets 202A and 202B) are stacked and subjected to pressure bonding.

An inorganic solid component for the glass ceramic green sheets may preferably be a mixed powder of a $SiO_2$—CaO—$Al_2O_3$—$B_2O_3$ glass powder and an alumina powder, for example.

The glass ceramic green sheets are preferably, for example, glass ceramic green sheets obtained by adding a resin, a dispersant, a plasticizer, and a solvent to the mixed powder, for example, mixing them to prepare a slurry, and performing a doctor blade method, for example, so as to have a thickness of about 0.1 mm.

The glass ceramic green sheets are preferably, for example, glass ceramic green sheets to have an average thermal expansion coefficient at about 30° C. to about 300° C. of about 5.5 ppm·$K^{-1}$ and a thermal conductivity of about 3 W·$m^{-1}$·$K^{-1}$ after sintering. As illustrated in FIG. 17B, the stacked glass ceramic green sheets 202 include an opening 203 in which a heat generating element-mounting wiring line is to be disposed.

The dimensions of the opening are preferably designed in accordance with the dimensions of a heat generating element-mounting wiring line to be formed.

Furthermore, conductive paste portions to define and function as inner wiring layers and via conductors are preferably not disposed in the glass ceramic green sheets 202 (202A and 202B) that define the opening 203 in which a heat generating element-mounting wiring line is to be disposed. This can provide a heat generating element-mounting module in which inner wiring layers are disposed at positions higher than that of the heat generating element-mounting wiring line in a thickness direction of the highly thermally conductive ceramic insulating layer.

Figure 17C:
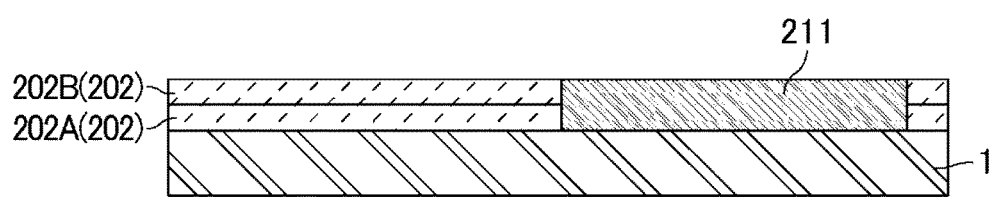

Subsequently, as illustrated in FIG. 17C, the opening 203 formed in the glass ceramic green sheets 202 is filled with a conductive paste 211 to define and function as a heat generating element-mounting wiring line.

The conductive paste 211 is preferably a paste containing silver or copper, for example.

Figure 17D:
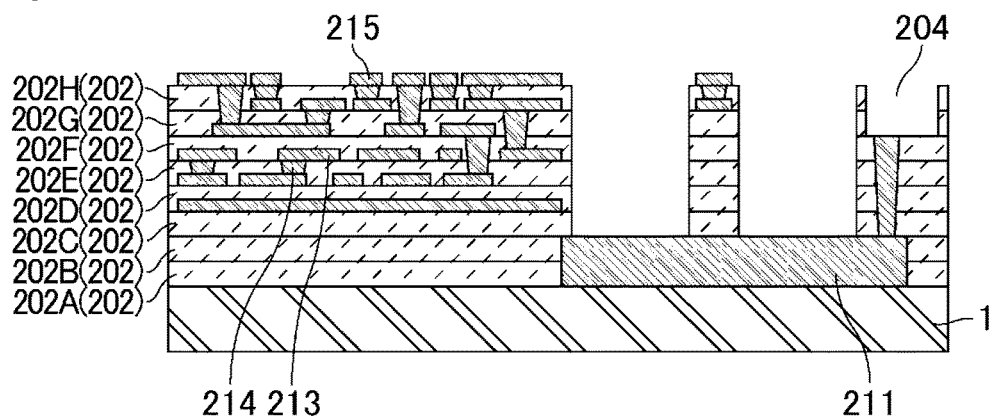

Subsequently, as illustrated in FIG. 17D, glass ceramic green sheets 202 are further stacked.

The glass ceramic green sheets disposed at positions higher than that of the heat generating element-mounting wiring line preferably include conductive paste portions to define and function as inner wiring layers, surface-layer wiring lines, or via conductors, for example.

For example, vias formed in the glass ceramic green sheets 202 with a laser puncher, a mechanical puncher, or the like, for example, are filled with a metal paste by printing to form conductive paste portions 214 for via conductors. A conductive paste is printed on surfaces of the glass ceramic green sheets 202 in a pattern for inner wiring layers to form conductive paste portions 213 for inner wiring layers.

A conductive paste is printed on a surface of the uppermost glass ceramic green sheet 202 (202H) in a pattern for surface-layer wiring lines to form conductive paste portions 215 for surface-layer wiring lines.

The conductive paste used in forming the conductive paste portions is preferably a paste containing silver or copper, for example.

FIG. 17D illustrates a state in which six glass ceramic green sheets 202 (glass ceramic green sheets 202C, 202D, 202E, 202F, 202G, and 202H) are further stacked and pressure bonding is performed by hot pressing, for example.

The two uppermost glass ceramic green sheets (202G and 202H) among the glass ceramic green sheets 202 include an opening 204 in which a power supply wiring line is to be formed.

Figure 17E:
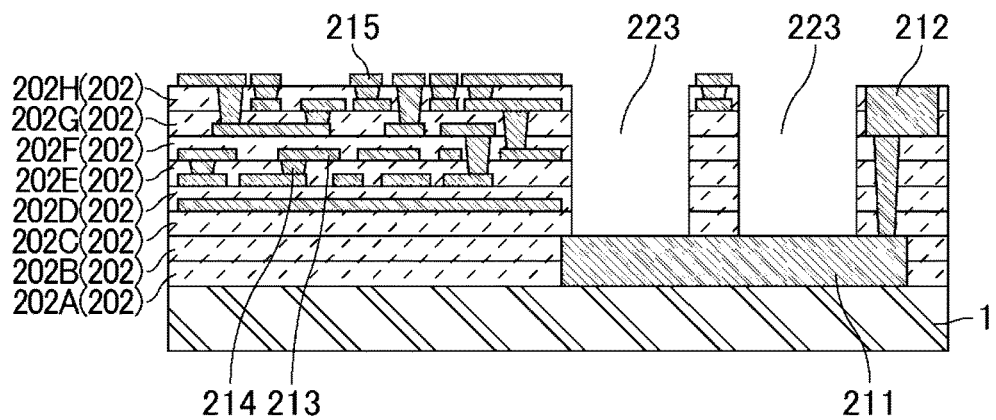

Subsequently, as illustrated in FIG. 17E, the opening 204 used in power supply wiring lines formed in the two uppermost glass ceramic green sheets 202 (202G and 202H) is filled with a conductive paste 212 used in power supply wiring lines.

The conductive paste 212 is preferably a paste containing silver or copper, for example.

Through these processes, cavities 223 to define and function as heat generating element-mounting portions are disposed that are surrounded by the glass ceramic green sheets 202 and that include a bottom at which the conductive paste 211 to define and function as a heat generating element-mounting wiring line is present.

Subsequently, as illustrated in FIG. 18A, constraining layers 231 are preferably formed on the uppermost surface layer (202H) of the glass ceramic green sheets 202 and inside the cavities 223.

The constraining layers are each preferably formed by adding a resin, a dispersant, a plasticizer, and a solvent, for example, to a ceramic powder that is a material not sintered in the subsequent pressure firing process, mixing them to prepare a slurry, and performing a doctor blade method to form a sheet. The ceramic powder used in making the constraining layers is preferably an alumina powder. The thickness of the obtained sheet is, for example, preferably about 0.2 mm.

By disposing the constraining layers, the shrinkage of the glass ceramic green sheets in the subsequent pressure firing process is able to be controlled and thus the dimensional accuracy of the glass ceramic insulating layers is able to be improved.

The product obtained through these processes is a highly thermally conductive ceramic sintered body to define and function as a highly thermally conductive ceramic insulating layer 1 and a multilayer body 101 of the glass ceramic green sheets 202 to define and function as glass ceramic insulating layers 2 after firing.

Then, the multilayer body 101 is pressure-fired.

FIG. 18B schematically illustrates a multilayer body 102 after pressure firing.

The firing temperature during pressure firing is preferably about 850° C. or higher and about 990° C. or lower, for example.

The preferred pressure firing time (the holding time at a firing temperature) is about 10 minutes or more and about 30 minutes or less, for example.

The pressure during pressure firing is preferably about 0.1 kgf/$cm^2$ or more and about 30.0 kgf/$cm^2$ or less, for example.

The atmosphere during pressure firing is preferably an air atmosphere, for example.

As a result of pressure firing, the low-temperature-sintering ceramic material of the stacked glass ceramic green sheets 202 is sintered into a glass ceramic insulating layer 2.

The glass ceramic insulating layer 2 includes eight glass ceramic insulating layers (2A, 2B, 2C, 2D, 2E, 2F, 2G, and 2H).

As a result of pressure firing, the conductive paste 211 to define and function as a heat generating element-mounting wiring line is formed into a heat generating element-mounting wiring line 11, and the conductive paste 212 to define and function as a power supply wiring line is formed into a power supply wiring line 12.

As a result of pressure firing, the conductive paste portions 214 are formed into via conductors 14, the conductive paste portions 213 are formed into inner wiring layers 13, and the conductive paste portions 215 are formed into surface-layer wiring lines 15.

In the multilayer body 101 before pressure firing, the glass ceramic green sheets 202 are directly disposed on the highly thermally conductive ceramic insulating layer 1.

As a result of pressure firing, a multilayer body in which the glass ceramic insulating layer 2 is directly disposed on the highly thermally conductive ceramic insulating layer 1 is obtained. Furthermore, as a result of pressure firing, the glass ceramic component diffuses into the highly thermally conductive ceramic insulating layer, and a diffusion layer is formed at the interface between the highly thermally conductive ceramic insulating layer and the glass ceramic insulating layer, thereby achieving high bonding strength.

In the multilayer body 101 before pressure firing, the conductive paste 211 to define and function as a heat generating element-mounting wiring line is directly disposed on the highly thermally conductive ceramic insulating layer 1.

As a result of pressure firing, the heat generating element-mounting wiring line 11 is able to be directly disposed on the highly thermally conductive ceramic insulating layer 1.

Subsequently, as illustrated in FIG. 18C, the constraining layers 231 are removed from the multilayer body 102.

The constraining layers is able to be removed by ultrasonic cleaning.

When the constraining layers are removed, the cavities 223 before firing become heat generating element-mounting portions 3.

Furthermore, if necessary, a nickel coating and a gold coating are preferably formed on the exposed surfaces of the heat generating element-mounting wiring line 11, the surface-layer wiring lines 15, and the power supply wiring line 12.

Thus, a composite ceramic multilayer substrate 100 on which heat generating elements are not mounted is obtained.

The composite ceramic multilayer substrate obtained through these processes is specifically as follows.

The highly thermally conductive ceramic insulating layer is preferably, for example, made of about 96% alumina and has a thickness of about 0.5 mm, a thermal conductivity of about 21 $W \cdot m^{-1} \cdot K^{-1}$, a thermal expansion coefficient at about 30° C. to about 300° C. of about 7.8 $ppm \cdot K^{-1}$, a flexural strength (three-point bending strength) of about 350 MPa, and a fracture toughness of about 5 $MPa \cdot m^{1/2}$.

The glass ceramic insulating layer is defined by eight glass ceramic insulating layers. Each of the glass ceramic insulating layers preferably has a thickness of about 0.05 mm and the glass ceramic insulating layers have a total thickness of about 0.4 mm, for example. The glass ceramic insulating layers include inner wiring layers preferably having a thickness of about 0.005 mm, for example, in necessary portions thereof.

At the interface between the highly thermally conductive ceramic insulating layer and the glass ceramic insulating layer, a glass ceramic component contained in the glass ceramic insulating layer diffuses into the highly thermally conductive ceramic insulating layer to form a diffusion layer. Thus, the highly thermally conductive ceramic insulating layer and the glass ceramic insulating layer are joined to each other.

The heat generating element-mounting portion is disposed, and the heat generating element-mounting portion preferably has a depth of 0.3 mm, for example.

A heat generating element-mounting wiring line preferably having a thickness of about 0.1 mm, for example, is formed at the bottom of the heat generating element-mounting portion and on the surface of the highly thermally conductive ceramic insulating layer.

A power supply wiring line is provided on the surface of the glass ceramic insulating layer, that is, on the surface of the composite ceramic multilayer substrate before mounting.

Heat generating elements 21 are mounted on the composite ceramic multilayer substrate 100 and other necessary processes are performed to obtain a heat generating element-mounting module according to the present invention.

In FIG. 19A, heat generating elements 21 are mounted in the heat generating element-mounting portions 3.

A joining material 31 is applied onto the heat generating element-mounting wiring line 11 using a dispenser. Then, heat generating elements 21 are placed thereon and heat-treated. Thus, the heat generating elements 21 are mounted.

The joining material 31 used to mount the heat generating elements is preferably a nano-silver sintered material, for example.

The heat treatment conditions are preferably, for example, a nitrogen atmosphere and about 300° C. for about 10 minutes.

The heat generating elements 21 may be elements such as SiC-MOSFETs having a thickness of about 0.15 mm, for example.

Subsequently, as illustrated in FIG. 19B, heat generating element-controlling elements 22 are mounted.

A joining material 32 is preferably applied onto the surface-layer wiring lines 15 by screen printing, for example, and then heat generating element-controlling elements 22 are mounted. The heat generating element-controlling elements 22 are able to be mounted by placing the heat generating element-controlling elements 22 on the joining material 32 and performing reflow treatment.

For example, a Sn-3.5Ag-0.5Cu solder is able to be used as the joining material 32 to mount the heat generating element-controlling elements. The reflow treatment is preferably performed in a nitrogen atmosphere at a maximum temperature of about 250° C. for a holding time of about 50 seconds, for example.

Through the above processes, a heat generating element-mounting module 200 according to a preferred embodiment of the present invention is produced.

If necessary, as illustrated in FIG. 19C, the heat generating elements 21 are electrically connected to the wiring lines (surface-layer wiring lines 15) disposed on the glass ceramic insulating layer 2 through wire bonding 24.

Furthermore, the heat generating element-mounting portions 3 in which the heat generating elements 21 have been mounted are preferably filled with a sealing resin 25 to seal the heat generating elements 21.

The heat generating element-mounting module obtained through the above processes is specifically as follows. The joining material of joining the heat generating elements has a thickness of about 0.05 mm and the SiC-MOSFET serving as the heat generating element has a thickness of about 0.15 mm, for example. In this case, the surface of the SiC-MOSFET is positioned at a height of about 0.2 mm, for example, from the bottom surface of the heat generating element-mounting portion in the heat generating element-mounting module before mounting. Since the heat generating element-mounting portion has a depth of about 0.3 mm, for example, the surface of the SiC-MOSFET is positioned lower than the surface of the heat generating element-mounting module by about 0.1 mm, for example.

In this positional relationship, the heat generating element-controlling elements are able to be prevented from being directly heated because of radiant heat generated during the operation of the SiC-MOSFET.

To check the joining strength between the highly thermally conductive ceramic insulating layer and the glass ceramic insulating layer, a multilayer body obtained by stacking glass ceramic green sheets having a thickness of about 0.5 mm and containing a $SiO_2$—$CaO$—$Al_2O_3$—$B_2O_3$ glass and alumina as inorganic solid components on a about 96% alumina substrate having a thickness of about 0.5 mm, for example, was pressure-fired for joining at a pressure of about 5.0 kgf/cm$^2$ at a maximum temperature of about 870° C. for a holding time of about 10 minutes, for example.

The resulting product was cut into a length of about 40 mm and a width of about 5 mm, for example, to prepare a bending test sample.

This bending test sample was subjected to three-point bending (span: about 30 mm, indenter feeding speed: about 2 mm·min$^{-1}$) by applying an indenter load from the alumina substrate side, and the broken portion was observed with a scanning electron microscope (SEM).

Figure 20:
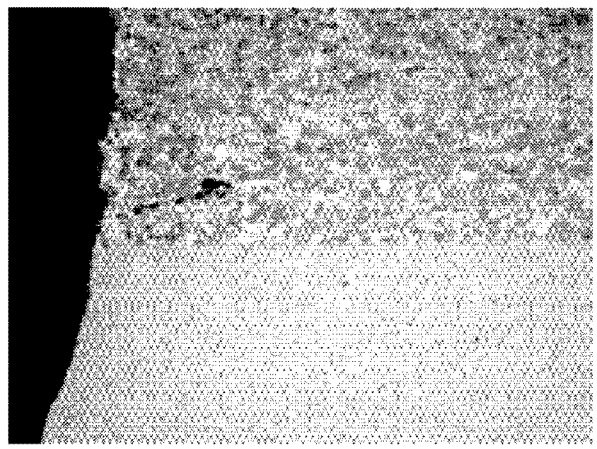
FIG. 20 is a scanning electron micrograph of a broken portion in a bending test.

FIG. 20 is a scanning electron micrograph of the broken portion in the bending test.

Since cracks were not observed at the joining interface between the highly thermally conductive ceramic insulating layer (alumina substrate) and the glass ceramic insulating layer, the highly thermally conductive ceramic insulating layer and the glass ceramic insulating layer were found to be firmly joined to each other at their interface.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite ceramic multilayer substrate comprising:
   a glass ceramic insulating layer including a wiring layer; and
   a highly thermally conductive ceramic insulating layer made of a ceramic material having a higher thermal conductivity than the glass ceramic insulating layer; wherein
   the glass ceramic insulating layer is provided on one main surface of the highly thermally conductive ceramic insulating layer or both main surfaces of the highly thermally conductive ceramic insulating layer directly and/or with a wiring layer interposed therebetween; and
   when viewed in a direction perpendicular or substantially perpendicular to a main surface of the composite ceramic multilayer substrate, the composite ceramic multilayer substrate includes at least one heat generating element-mounting portion which is surrounded by the glass ceramic insulating layer and at which a heat generating element-mounting wiring line provided directly on the main surface of the highly thermally conductive ceramic insulating layer is exposed.

2. The composite ceramic multilayer substrate according to claim 1, wherein the glass ceramic insulating layer is provided on both main surfaces of the highly thermally conductive ceramic insulating layer directly and/or with a wiring layer interposed therebetween.

3. The composite ceramic multilayer substrate according to claim 2, wherein a via electrode that electrically connects one main surface of the highly thermally conductive ceramic insulating layer to another main surface is provided.

4. The composite ceramic multilayer substrate according to claim 1, wherein a portion of the main surface of the highly thermally conductive ceramic insulating layer is exposed at a periphery of the composite ceramic multilayer substrate.

5. The composite ceramic multilayer substrate according to claim 4, wherein a through hole used in screw fixing is provided in the portion of the main surface of the highly thermally conductive ceramic insulating layer, the portion being exposed at the periphery of the composite ceramic multilayer substrate.

6. The composite ceramic multilayer substrate according to claim 4, wherein an electrode to which a conductor used in power supply input/output is welded is provided in the portion of the main surface of the highly thermally conductive ceramic insulating layer, the portion being exposed at the periphery of the composite ceramic multilayer substrate.

7. The composite ceramic multilayer substrate according to claim 1, wherein the highly thermally conductive ceramic insulating layer is partially disposed in a region including at least a portion immediately below the heat generating element-mounting portion in a main surface direction of the composite ceramic multilayer substrate.

8. The composite ceramic multilayer substrate according to claim 1, wherein the heat generating element-mounting wiring line is a Cu plate having a thickness of about 0.04 mm or more.

9. The composite ceramic multilayer substrate according to claim 1, wherein the glass ceramic insulating layer is directly provided on one main surface of the highly thermally conductive ceramic insulating layer or both main surfaces of the highly thermally conductive ceramic insulating layer, and a glass ceramic component contained in the glass ceramic insulating layer diffuses into the highly thermally conductive ceramic insulating layer.

10. The composite ceramic multilayer substrate according to claim 1, wherein the highly thermally conductive ceramic insulating layer has a higher heat capacity than the heat generating element-mounting wiring line.

11. The composite ceramic multilayer substrate according to claim 10, wherein the highly thermally conductive ceramic insulating layer has a larger total volume than the heat generating element-mounting wiring line.

12. The composite ceramic multilayer substrate according to claim 1, wherein the glass ceramic insulating layer has a total thickness larger than a thickness of the heat generating element-mounting wiring line.

13. The composite ceramic multilayer substrate according to claim 1, wherein a thermal conductivity of the ceramic material of the highly thermally conductive ceramic insulating layer is about three times or more higher than that of a glass ceramic contained in the glass ceramic insulating layer.

14. The composite ceramic multilayer substrate according to claim 13, wherein the ceramic material of the highly thermally conductive ceramic insulating layer has a thermal conductivity of about 15 W·m$^{-1}$·K$^{-1}$ or more, and the glass ceramic contained in the glass ceramic insulating layer has a thermal conductivity of about 5 W·m$^{-1}$·K$^{-1}$ or less.

15. The composite ceramic multilayer substrate according to claim 1, wherein the glass ceramic insulating layer includes an inner wiring layer disposed therein, and the inner wiring layer is disposed at a position higher than that of the heat generating element-mounting wiring line in a thickness direction of the highly thermally conductive ceramic insulating layer.

16. The composite ceramic multilayer substrate according to claim 1, wherein the at least one heat generating element-mounting portion includes a plurality of heat generating element-mounting portions including a first heat generating element-mounting portion and a second heat generating element-mounting portion are provided on the heat generating element-mounting wiring line, and a partition wall containing the same glass ceramic as the glass ceramic insulating layer is disposed between the first heat generating element-mounting portion and the second heat generating element-mounting portion.

17. The composite ceramic multilayer substrate according to claim 1, wherein a portion of the glass ceramic insulating layer is also disposed in a portion that covers a periphery of the heat generating element-mounting wiring line.

18. The composite ceramic multilayer substrate according to claim 1, wherein a difference in average thermal expansion coefficient at about 30° C. to about 300° C. between the highly thermally conductive ceramic insulating layer and the glass ceramic insulating layer is about 3.5 ppm·K$^{-1}$ or less.

19. The composite ceramic multilayer substrate according to claim 1, wherein the heat generating element-mounting wiring line contains silver or copper, and the ceramic material of the highly thermally conductive ceramic insulating layer contains silicon nitride, aluminum nitride, alumina, or silicon carbide.

20. The composite ceramic multilayer substrate according to claim 19, wherein the heat generating element-mounting wiring line contains the silver or the copper in an amount of about 98 wt % or more.

21. The composite ceramic multilayer substrate according to claim 19, wherein the glass ceramic insulating layer contains a $SiO_2$—CaO—$Al_2O_3$—$B_2O_3$ glass ceramic or a $SiO_2$—MgO—$Al_2O_3$—$B_2O_3$ glass ceramic.

22. A heat generating element-mounting module comprising:
the composite ceramic multilayer substrate according to claim 1; and
a heat generating element mounted in the heat generating element-mounting portion of the composite ceramic multilayer substrate.

23. The heat generating element-mounting module according to claim 22, wherein the heat generating element is at least one element selected from the group consisting of a power element, a control element, a passive component, and a light-emitting element.

24. The heat generating element-mounting module according to claim 23, wherein the power element is an element made of a wide band gap semiconductor.

25. The heat generating element-mounting module according to claim 24, wherein the wide band gap semiconductor is silicon carbide or gallium nitride.

26. The heat generating element-mounting module according to claim 23, wherein the light-emitting element is at least one element selected from the group consisting of an LED, an organic EL element, an LIDAR element, an RADAR element, and a millimeter-wave element.

27. The heat generating element-mounting module according to claim 22, wherein
the heat generating element-mounting wiring line and the glass ceramic insulating layer are disposed on a same plane of the highly thermally conductive ceramic insulating layer, and the heat generating element is disposed on a side of the heat generating element-mounting wiring line opposite to a side on which the highly thermally conductive ceramic insulating layer is disposed; and
a heat generating element-controlling element that controls driving of the heat generating element is disposed on a side of the glass ceramic insulating layer opposite to a side on which the highly thermally conductive ceramic insulating layer is disposed, and the glass ceramic insulating layer has a total thickness larger than a sum of a thickness of the heat generating element-mounting wiring line and a height of the heat generating element in a thickness direction of the highly thermally conductive ceramic insulating layer.

28. The heat generating element-mounting module according to claim 27, wherein the glass ceramic insulating layer is interposed between the heat generating element and the heat generating element-controlling element.

29. The heat generating element-mounting module according to claim 27, wherein the heat generating element-mounting portion is filled with a sealing resin to seal the heat generating element with the sealing resin.

30. A method of producing a composite ceramic multilayer substrate, comprising:
a step of forming a glass ceramic insulating layer on one main surface of a highly thermally conductive ceramic insulating layer made of a ceramic material having a higher thermal conductivity than a glass ceramic contained in the glass ceramic insulating layer or both main surfaces of the highly thermally conductive ceramic insulating layer directly and/or with a wiring layer interposed therebetween; and
a step of forming a heat generating element-mounting wiring line directly on a main surface of the highly thermally conductive ceramic insulating layer; wherein
when the composite ceramic multilayer substrate is viewed in a direction perpendicular or substantially perpendicular to a main surface of the composite ceramic multilayer substrate, at least one heat generating element-mounting portion is formed which is surrounded by the glass ceramic insulating layer and at which the heat generating element-mounting wiring line formed directly on the main surface of the highly thermally conductive ceramic insulating layer is exposed.

31. The method of producing a composite ceramic multilayer substrate according to claim 30, wherein the glass ceramic insulating layer is directly formed on the highly thermally conductive ceramic insulating layer by pressure-firing a highly thermally conductive ceramic sintered body to defined and function as the highly thermally conductive ceramic insulating layer and a multilayer body of glass ceramic green sheets to define and function as the glass ceramic insulating layer.

32. The method of producing a composite ceramic multilayer substrate according to claim 31, wherein the pressure-firing is performed at a pressure of about 0.1 kgf/cm$^2$ or more and about 30.0 kgf/cm$^2$ or less.

* * * * *